United States Patent [19]

Wilcox et al.

[11] Patent Number: 5,586,300
[45] Date of Patent: Dec. 17, 1996

[54] FLEXIBLE ADDRESSING MEMORY CONTROLLER WHEREIN MULTIPLE MEMORY MODULES MAY BE ACCESSED ACCORDING TO COMPARISON OF CONFIGURATION ADDRESSES

[75] Inventors: Jeffrey A. Wilcox, Bourne; Jeffrey L. Winkler, Princeton, both of Mass.

[73] Assignee: EMC Corporation, Hopkinton, Mass.

[21] Appl. No.: 277,880

[22] Filed: Jul. 20, 1994

[51] Int. Cl.$^6$ .............................. G06F 12/06; G06F 13/00
[52] U.S. Cl. .................. 395/477; 395/440; 395/497.01; 395/497.03; 364/926.92; 364/964.25; 364/965.78; 364/965.79; 364/DIG. 1; 364/DIG. 2
[58] Field of Search .................. 395/497.01, 497.03, 395/440, 477; 364/926.92, 964.25, 965.78, 965.79

[56] References Cited

U.S. PATENT DOCUMENTS

| | | | |
|---|---|---|---|
| 4,513,374 | 4/1985 | Hooks, Jr. ........................ | 395/425 |
| 4,562,532 | 12/1985 | Nishizawa et al. ................ | 395/497.01 |
| 4,571,676 | 2/1986 | Mantellina et al. ............... | 395/497.03 |
| 4,580,215 | 4/1986 | Morton ............................. | 395/425 |
| 4,679,167 | 7/1987 | Finnell ............................. | 395/497.01 |
| 5,012,408 | 4/1991 | Conroy ............................. | 395/497.03 |
| 5,119,486 | 6/1992 | Albonesi .......................... | 395/497.03 |
| 5,129,069 | 7/1992 | Helm et al. ...................... | 395/497.03 |
| 5,175,836 | 12/1992 | Morgan ............................ | 395/497.03 |
| 5,276,832 | 1/1994 | Holman, Jr. ..................... | 395/497.03 |
| 5,305,446 | 4/1994 | Leach et al. ..................... | 395/425 |
| 5,329,630 | 7/1994 | Baldwin ........................... | 395/425 |
| 5,390,313 | 2/1995 | Yanai et al. ..................... | 395/439 |
| 5,420,998 | 5/1995 | Horning ........................... | 395/440 |

*Primary Examiner*—Frank J. Asta
*Attorney, Agent, or Firm*—Weingarten, Schurgin, Gagnebin & Hayes

[57] ABSTRACT

A controller capable of performing the flexible addressing of memory modules. In one embodiment, involving cache memory, a cache controller maintains, for each slot in cache memory, a read base address and a write base address for the slot and certain characteristics of the SIMM residing in the slot. The use of separate write and read addresses permits more than one cache memory SIMM to be written to with a single write address and permits cache memory to be non-contiguous and thus more robust with respect to SIMM failures. The maintenance of a table of SIMM characteristics permits volatile and non-volatile SIMMs to be used together in cache memory.

16 Claims, 41 Drawing Sheets

| | | | |
|---|---|---|---|
| S7SET<21>\I — 126P | | S6SET<21>\I — 104P | |
| S7SET<20>\I — 124P | | S6SET<20>\I — 103P | |
| S7SET<19>\I — 125P | | S6SET<19>\I — 102P | |
| S7SET<18>\I — 123P | | S6SET<18>\I — 100P | |
| S7SET<17>\I — 122P | | S6SET<17>\I — 101P | |
| S7SET<16>\I — 121P | | S6SET<16>\I — 99P | |
| S7SET<15>\I — 120P | | S6SET<15>\I — 97P | |
| S7SET<14>\I — 119P | | S6SET<14>\I — 98P | |
| S7SET<13>\I — 118P | | S6SET<13>\I — 95P | |
| S7SET<12>\I — 117P | | S6SET<12>\I — 96P | |
| S7SET<11>\I — 116P | | S6SET<11>\I — 94P | |
| S7SET<10>\I — 115P | | S6SET<10>\I — 92P | |
| S7SET<9>\I — 114P | | S6SET<9>\I — 93P | |
| S7SET<8>\I — 113P | | S6SET<8>\I — 91P | |
| S7SET<7>\I — 112P | | S6SET<7>\I — 90P | |
| S7SET<6>\I — 111P | | S6SET<6>\I — 89P | |
| S7SET<5>\I — 109P | | S6SET<5>\I — 88P | |
| S7SET<4>\I — 110P | | S6SET<4>\I — 87P | |
| S7SET<3>\I — 108P | | S6SET<3>\I — 86P | |
| S7SET<2>\I — 106P | | S6SET<2>\I — 85P | |
| S7SET<1>\I — 107P | | S6SET<1>\I — 84P | |
| S7SET<0>\I — 105P | | S6SET<0>\I — 83P | |

*FIGURE 4a*

| | |
|---|---|
| S5SET<21>\I — 82P | S4SET<21>\I — 60P |
| S5SET<20>\I — 80P | S4SET<20>\I — 59P |
| S5SET<19>\I — 81P | S4SET<19>\I — 58P |
| S5SET<18>\I — 79P | S4SET<18>\I — 56P |
| S5SET<17>\I — 78P | S4SET<17>\I — 57P |
| S5SET<16>\I — 77P | S4SET<16>\I — 55P |
| S5SET<15>\I — 76P | S4SET<15>\I — 53P |
| S5SET<14>\I — 75P | S4SET<14>\I — 54P |
| S5SET<13>\I — 74P | S4SET<13>\I — 51P |
| S5SET<12>\I — 73P | S4SET<12>\I — 52P |
| S5SET<11>\I — 72P | S4SET<11>\I — 50P |
| S5SET<10>\I — 71P | S4SET<10>\I — 48P |
| S5SET<9>\I — 70P | S4SET<9>\I — 49P |
| S5SET<8>\I — 69P | S4SET<8>\I — 47P |
| S5SET<7>\I — 68P | S4SET<7>\I — 46P |
| S5SET<6>\I — 67P | S4SET<6>\I — 45P |
| S5SET<5>\I — 65P | S4SET<5>\I — 44P |
| S5SET<4>\I — 66P | S4SET<4>\I — 43P |
| S5SET<3>\I — 64P | S4SET<3>\I — 42P |
| S5SET<2>\I — 62P | S4SET<2>\I — 41P |
| S5SET<1>\I — 63P | S4SET<1>\I — 40P |
| S5SET<0>\I — 61P | S4SET<0>\I — 39P |

*FIGURE 4b*

| | | | |
|---|---|---|---|
| S3SET<21>\I — | 38P > | S2SET<21>\I — | 127P > |
| S3SET<20>\I — | 36P > | S2SET<20>\I — | 129P > |
| S3SET<19>\I — | 37P > | S2SET<19>\I — | 128P > |
| S3SET<18>\I — | 34P > | S2SET<18>\I — | 130P > |
| S3SET<17>\I — | 35P > | S2SET<17>\I — | 131P > |
| S3SET<16>\I — | 33P > | S2SET<16>\I — | 132P > |
| S3SET<15>\I — | 31P > | S2SET<15>\I — | 133P > |
| S3SET<14>\I — | 32P > | S2SET<14>\I — | 134P > |
| S3SET<13>\I — | 29P > | S2SET<13>\I — | 135P > |
| S3SET<12>\I — | 30P > | S2SET<12>\I — | 136P > |
| S3SET<11>\I — | 28P > | S2SET<11>\I — | 137P > |
| S3SET<10>\I — | 26P > | S2SET<10>\I — | 138P > |
| S3SET<9>\I — | 27P > | S2SET<9>\I — | 139P > |
| S3SET<8>\I — | 25P > | S2SET<8>\I — | 140P > |
| S3SET<7>\I — | 24P > | S2SET<7>\I — | 141P > |
| S3SET<6>\I — | 23P > | S2SET<6>\I — | 142P > |
| S3SET<5>\I — | 22P > | S2SET<5>\I — | 144P > |
| S3SET<4>\I — | 21P > | S2SET<4>\I — | 143P > |
| S3SET<3>\I — | 20P > | S2SET<3>\I — | 145P > |
| S3SET<2>\I — | 19P > | S2SET<2>\I — | 147P > |
| S3SET<1>\I — | 18P > | S2SET<1>\I — | 146P > |
| S3SET<0>\I — | 17P > | S2SET<0>\I — | 148P > |

*FIGURE 4c*

| | |
|---|---|
| S1SET<21>\I —[149P⟩ | S0SET<21>\I —[171P⟩ |
| S1SET<20>\I —[150P⟩ | S0SET<20>\I —[173P⟩ |
| S1SET<19>\I —[151P⟩ | S0SET<19>\I —[172P⟩ |
| S1SET<18>\I —[153P⟩ | S0SET<18>\I —[175P⟩ |
| S1SET<17>\I —[152P⟩ | S0SET<17>\I —[174P⟩ |
| S1SET<16>\I —[154P⟩ | S0SET<16>\I —[176P⟩ |
| S1SET<15>\I —[156P⟩ | S0SET<15>\I —[178P⟩ |
| S1SET<14>\I —[155P⟩ | S0SET<14>\I —[177P⟩ |
| S1SET<13>\I —[158P⟩ | S0SET<13>\I —[180P⟩ |
| S1SET<12>\I —[157P⟩ | S0SET<12>\I —[179P⟩ |
| S1SET<11>\I —[159P⟩ | S0SET<11>\I —[181P⟩ |
| S1SET<10>\I —[161P⟩ | S0SET<10>\I —[183P⟩ |
| S1SET<9>\I —[160P⟩ | S0SET<9>\I —[182P⟩ |
| S1SET<8>\I —[162P⟩ | S0SET<8>\I —[184P⟩ |
| S1SET<7>\I —[163P⟩ | S0SET<7>\I —[185P⟩ |
| S1SET<6>\I —[164P⟩ | S0SET<6>\I —[186P⟩ |
| S1SET<5>\I —[165P⟩ | S0SET<5>\I —[187P⟩ |
| S1SET<4>\I —[166P⟩ | S0SET<4>\I —[188P⟩ |
| S1SET<3>\I —[167P⟩ | S0SET<3>\I —[189P⟩ |
| S1SET<2>\I —[168P⟩ | S0SET<2>\I —[190P⟩ |
| S1SET<1>\I —[169P⟩ | S0SET<1>\I —[191P⟩ |
| S1SET<0>\I —[170P⟩ | S0SET<0>\I —[192P⟩ |

*FIGURE 4d*

DRAM SIMM READ/WRITE

INVSM READ

INVSM WRITE

INVSM READ/WRITE

SHADOWED WRITE

SHADOWED BYTEWRITE NO ERROR

SHADOWED READ W/ERROR OR SHADOWED BYTEWRITE W/ERROR

REFRESH

FIGURE 14

| ADDRESS | NOV | SIZE | READ | WRITE | SIMMSET VALUE |
|---------|-----|------|------|-------|---------------|
| A000 0040 | 0 | 02 | 08 | 08 | 00020808 |
| A000 0044 | 0 | 00 | 00 | 00 | 00000000 |
| A000 0048 | 0 | 08 | 00 | 00 | 00080000 |
| A000 004C | 0 | 00 | 00 | 00 | 00000000 |
| A000 0050 | 1 | 01 | 0A | 0A | 00210A0A |
| A000 0054 | 0 | 00 | 00 | 00 | 00000000 |
| A000 0058 | 0 | 00 | 00 | 00 | 00000000 |
| A000 005C | 0 | 00 | 00 | 00 | 00000000 |

WRITE
015F FFFFh
0140 0000h
013F FFFFh 0100 0000h
00FF FFFFh 0000 0000h

READ
015F FFFFh
0140 0000h
013F FFFFh 0100 0000h
00FF FFFFh 0000 0000h

2MB (SIMM 4)
4MB (SIMM 0)
16MB (SIMM 2)

FIGURE 15

| ADDRESS | NOV | SIZE | READ | WRITE | SIMMSET VALUE |
|---|---|---|---|---|---|
| A000 0040 | 0 | 02 | 0C | 0C | 00020C0C |
| A000 0044 | 0 | 02 | 0E | 0E | 00020E0E |
| A000 0048 | 0 | 08 | 00 | 00 | 00080000 |
| A000 004C | 0 | 08 | 20 | 00 | 00082000 |
| A000 0050 | 1 | 01 | 10 | 10 | 00211010 |
| A000 0054 | 1 | 02 | 2C | 0C | 00222C0C |
| A000 0058 | 1 | 04 | 08 | 08 | 00240808 |
| A000 005C | 1 | 04 | 28 | 08 | 00242808 |

PRIMARY

READ
021F FFFFh
0200 0000h
01FF FFFFh

01C0 0000h
01BF FFFFh 0180 0000h
017F FFFFh 0100 0000h
00FF FFFFh 0000 0000h

WRITE
021F FFFFh
0200 0000h
01FF FFFFh

01C0 0000h
01BF FFFFh 0180 0000h
017F FFFFh 0100 0000h
00FF FFFFh 0000 0000h

- 2MB (SIMM 4)
- 4MB (SIMM 1)
- 4MB (SIMM 0)
- 8MB (SIMM 6)
- 16MB (SIMM 3)

MIRROR

READ
05BF FFFFh 0580 0000h
057F FFFFh 0500 0000h
04FF FFFFh 0400 0000h

- 4MB (SIMM 5)
- 8MB (SIMM 7)
- 16MB (SIMM 2)

5,586,300

FLEXIBLE ADDRESSING MEMORY CONTROLLER WHEREIN MULTIPLE MEMORY MODULES MAY BE ACCESSED ACCORDING TO COMPARISON OF CONFIGURATION ADDRESSES

FIELD OF THE INVENTION

The invention relates in general to computer memory and more particularly to controllers for memory modules.

BACKGROUND OF THE INVENTION

Cache memory is typically fast memory utilized to hold data temporarily as the data is moved to or from disk storage. Cache memory may consist of a number of single inline memory modules or SIMMs. Each SIMM stores a predetermined amount of data. The sum of the capacity of the individual SIMMs determines the amount of cache memory available.

Typically all such SIMM based cache memories share the following characteristics. All SIMM of a single cache memory are of the same type, either volatile or non-volatile. This "same type" requirement is generally imposed because of the different cycle times required by volatile and non-volatile memory.

All cache memory must be contiguous. This means that the base address of each SIMM (with the exception of the zero base address) must be adjacent the maximum address of a previous SIMM. Because of this requirement that memory be contiguous, if a SIMM fails and is no longer accessible, all subsequent SIMMs are also inaccessible. Thus, under certain circumstances, a failure of a single SIMM can result in the entire cache memory becoming unusable.

Finally, all SIMM addresses must be unique. The requirement is imposed because a read request must not access two different SIMMs at the same time. Therefore, if a mirror image of data is to be maintained in cache memory, at least two write requests are required.

The present invention avoids these limitations.

SUMMARY OF THE INVENTION

The invention relates to a memory controller having reconfigurable addressing of memory modules. In one embodiment involving cache memory the cache controller maintains, for each slot in cache memory, a read base address and a write base address for the slot and the nature (volatile or non-volatile) and size of the SIMM residing in the slot.

By maintaining separate write and read addresses for each SIMM, more than one cache memory SIMM may be accessed and may be written to with a single write address. In this manner, mirror image data may be retained in cache memory using a single write request. Because each SIMM still has a different read address even though more than one SIMM can share a write address, multiple SIMMs do not respond to a single read request.

Further, by maintaining a write and read address for each SIMM in cache memory, cache memory is no longer required to be contiguous. The failure of a single SIMM does not prevent SIMMs having subsequent addresses from being accessed. A cache utilizing the SIMM controller of the invention is more flexible than prior art systems in the event of a SIMM failure.

Finally, by maintaining a record of the type and size of the SIMM in each slot in cache memory, volatile and non-volatile SIMMs may to be used together, even though these SIMMs have different cycle times.

BRIEF DESCRIPTION OF THE DRAWINGS

The above and further advantages of this invention may be better understood by referring to the following description taken in conjunction with the accompanying drawing, in which:

FIGS. 4–4d is a logic diagram of an embodiment of eight single inline memory module (SIMM) registers of the register logic block shown in FIGS. 3a and 3d;

FIG. 14 is an embodiment of a memory map and register address table for an embodiment of the flexible address controller of the invention in which memory space is contiguous and the read and write address for each individual SIMM are the same;

FIG. 15 is an embodiment of a memory map and register address table for an embodiment of the flexible address controller of the invention in which memory space has been partitioned in primary and mirrored memory.

DESCRIPTION OF THE PREFERRED EMBODIMENT

Figure 1:
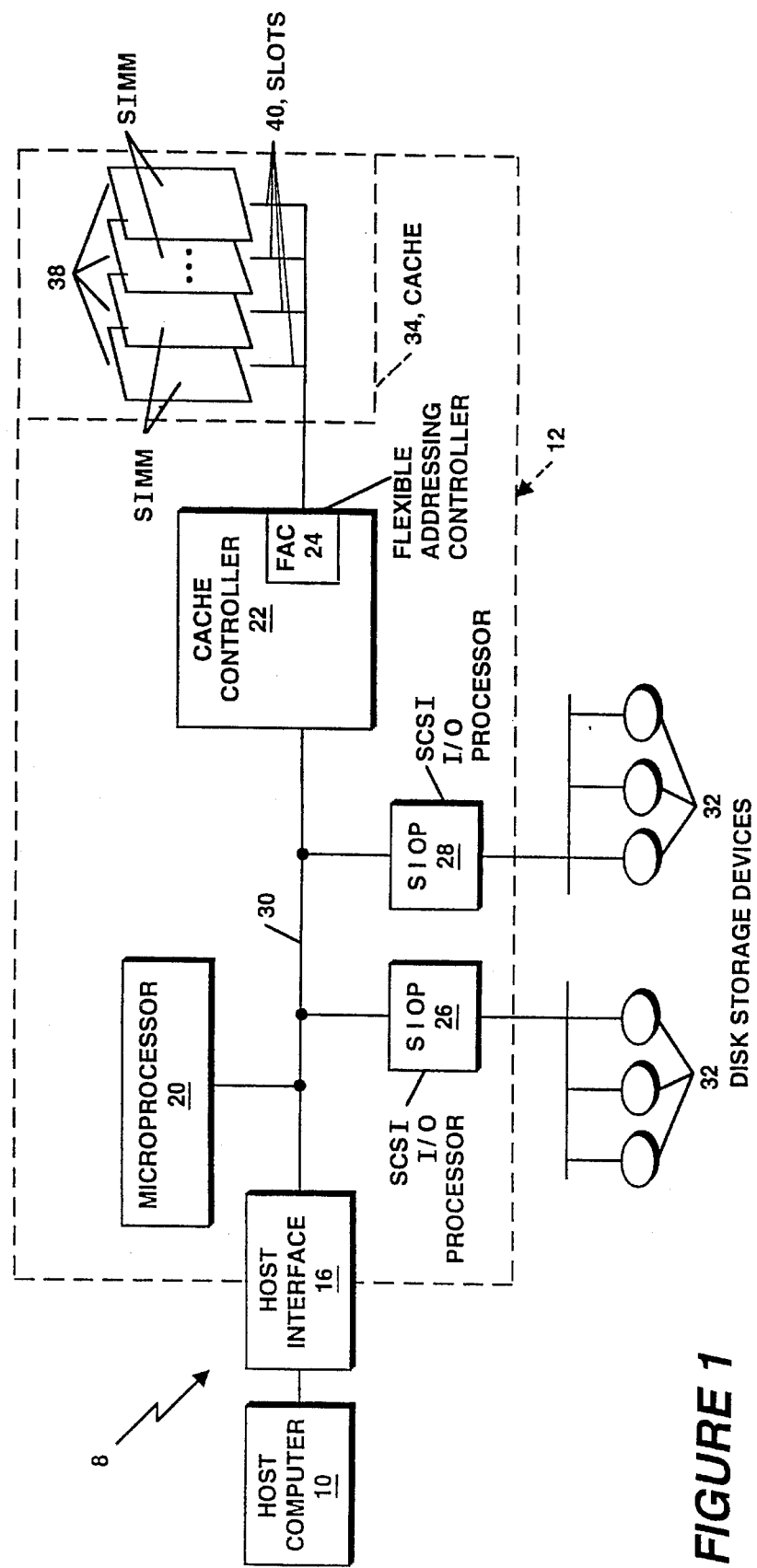
FIG. 1 is a block diagram of a computer system with a cache controller.

In brief overview, a block diagram of an embodiment of a computer system 8 utilizing the invention is depicted in FIG. 1. A host computer 10 is in electrical communication with a disk controller through a host interface 16. The disk controller 12 includes a microprocessor 20 (in one embodiment a Motorola 68030), a cache controller 22 including a flexible addressing controller (FAC) 24 (in one embodiment, in the form of an application specific integrated circuit or ASIC) and at least one SCSI I/O processor (SIOP) 26, 28 connected together by an internal bus 30. Each SIOP 26, 28 is in electrical communication with at least one disk storage device 32. The SIOP 26, 28 controls the flow of data between a given disk storage device 32 in electrical communication with the SIOP 26, 28 and a cache controller 22, in response to commands from the microprocessor 20. The cache controller 22 and FAC 24 are in electrical communication with the cache memory 34 consisting of at least one single in-line memory module (SIMM) 38. In one embodiment the cache memory 34 includes a total of 8 slots 40 to hold the SIMMs 38 and to thereby provide up to 512 megabytes of storage space. Each SIMM maintains 3 bits of information which identify its size and type (volatile, for example dynamic random access memory or DRAM, or non-volatile, for example static random access memory or SRAM).

Figure 1A:
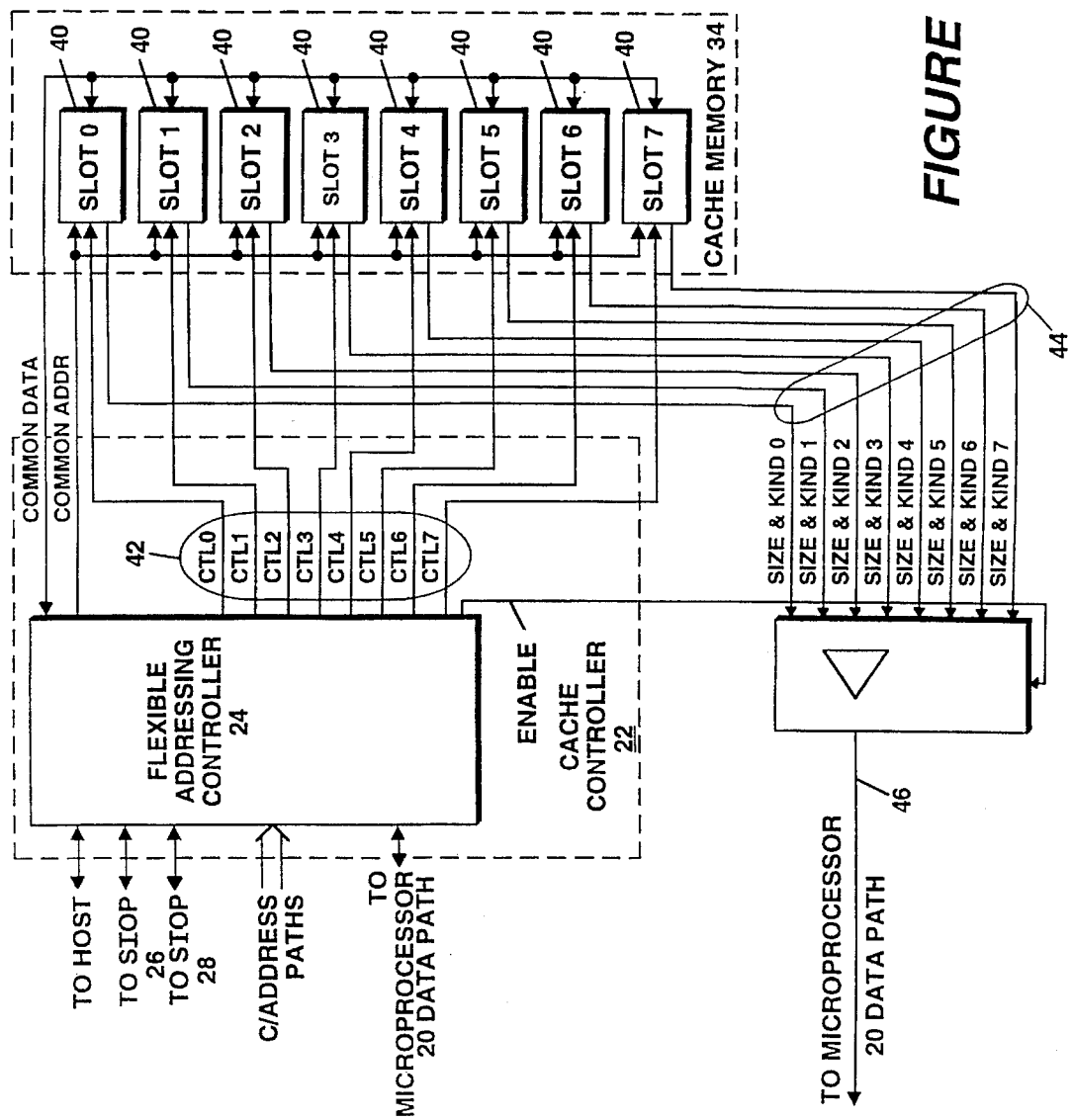
FIG. 1a is a block diagram of an embodiment of a cache controller of FIG. 1 with a flexible addressing controller of the invention.

Referring also to FIG. 1a, the flexible addressing controller 24 of the cache controller 22 includes a number of bidirectional data paths to the host, SIOP 26, SIOP 28, the microprocessor 20 and the memory modules 38 of cache memory 34; a number of unidirectional control lines (CTL0-7) 42 to the memory modules 38 of cache memory 34; and a number of unidirectional data lines 44, 46 from the memory modules 38 of cache memory 34 and to the microprocessor 20. The control lines 42 are used by the flexible addressing controller 24 to access specific memory modules 38 of the cache memory 34. The unidirectional data lines 44 are used to provide the microprocessor 20 with information concerning the size and type (volatile or non-volatile) of SIMMs 38 located in each of the slots of the cache memory 34.

Figure 1B:
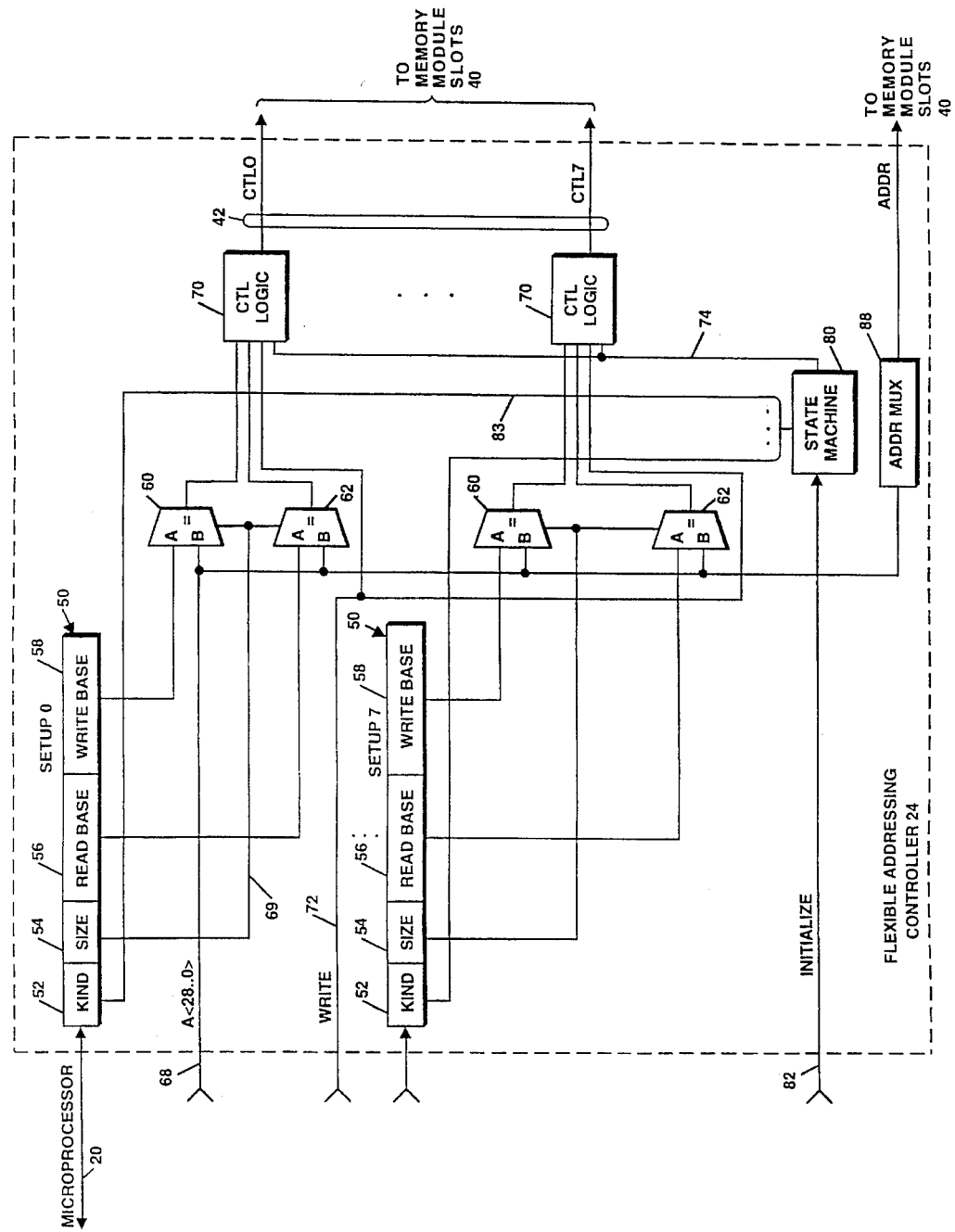
FIG. 1b is a high level block diagram of an embodiment of the flexible addressing controller of the invention.

Referring to FIG. 1b, the flexible addressing controller 24, includes a SETUP register 50 for each slot 40 of cache memory 34. Each SETUP register 50 is written to and read from by the microprocessor 20. The SETUP register 50, in one embodiment, is 22 bits long, with one bit denoting whether the SIMM in the respective slot is volatile or non-volatile 52, five bits denoting the size of the SIMM 54, eight bits defining the base read address of the SIMM 56 and eight bits defining the base write address of the SIMM 58.

Each slot 40 also has associated with it a pair of comparator units 60, 62 for each of the CPU, SIOP, HOST and RAID ports. One comparator unit 60 has one input from the base write address portion 58 of the SETUP register 50 and one input from the address lines 68 from one of the five ports. Similarly, the other comparator unit 62 has one input from the base read address portion 56 of the SETUP register 50 and one input from the same address lines 68 from the same one of the five ports. Control lines 69 from the size portion 54 of the SETUP register 50 are used to control the operation of the comparator unit 60, 62 as discussed below.

Each slot also has control logic 70 associated with it. The output signals from each pair of comparator units 60, 62 are input signals to respective control logic 70. Each control logic 70 also has a write control signal 72 from the same one of the five ports, and control signals 74 provided by a state machine 80 within the flexible addressing controller 24. The state machine 80 is placed into an initial state by the initialization signal 82 provided by logic associated with the controller. Another input signal 83 to the state machine 80 is provided by one bit 52 of the SETUP register 50 providing information as to whether any active SIMM is volatile or non-volatile.

The signals on the control lines 42 of the control logic 70 provide row address strobe (RAS), column address strobe (CAS) and write enable (WE) to the proper memory slot 40 for writing, reading and memory refresh. Additionally, an address multiplexer 88, whose input signal is also provided by the address lines 68, provides the RAS/CAS addresses for the memory modules 38.

Figure 1C:
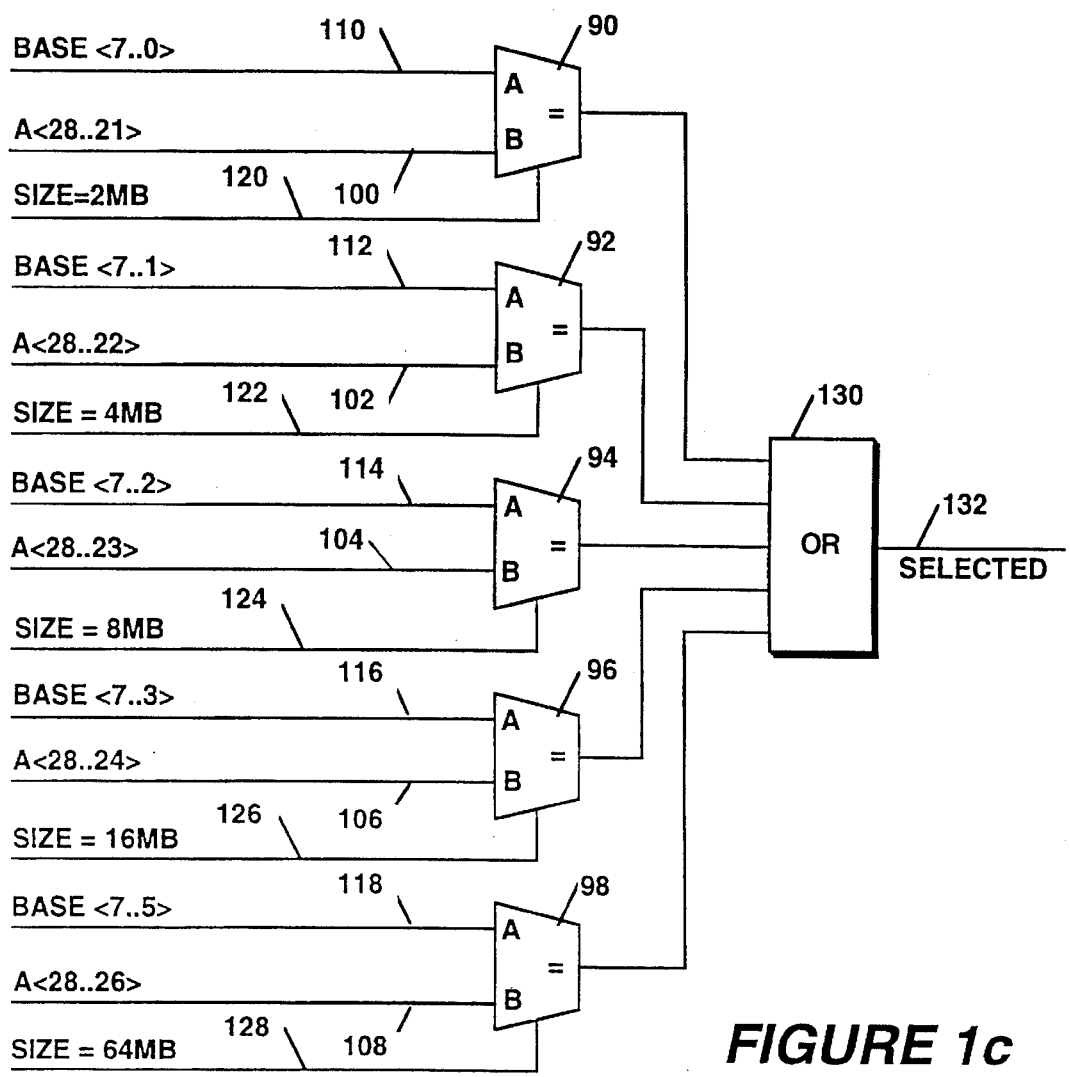
FIG. 1c is a block diagram of one of the address selection multiplexers shown in FIG. 1b.

Referring to FIG. 1c, each comparator unit 60, 62, includes five comparators 90, 92, 94, 96, 98, one for each SIMM capacity. One input 100, 102, 104, 106, 108 to each comparator 90–98, respectively, is a decreasing number of bits of the SIMM address 68. For example, the first comparator 90 has as an input signal 100, the eight high order bits of the address 68. The second comparator 92 has only the seven high order bits of the address 68, while the third comparator 94 only the six high order bits, and the fourth comparator 96 only the five high order bits. The fifth comparator 98 has only the three high order bits.

The other input to 110, 112, 114, 116, 118 each comparator 90–98, respectively, is a decreasing number of bits of the base address. The base address is either the write base address 58 or the read base address 56 depending upon whether the comparator unit 60, 62, to which the comparator 90–98 belongs, is a write comparator 60 or a read comparator 62. To continue the example, the first comparator 90 has as an input signal 110, all eight bits of the base register 56, 58. The second comparator 92 has only the seven high order bits of the base register 56, 58, while the third comparator 94 only the six high order bits, and the fourth comparator 96 only the five high order bits. The fifth comparator 98 has only the three high order bits.

In addition each comparator 90–98 has a control signal 120, 122, 124, 126, 128, respectively, which corresponds to one bit of the five bits of the size portion 54 of the SETUP register 50. In this way, the size 54 of the SIMM 38 in the slot 40 is used to enable the comparator which corresponds to the size of the SIMM 38 in the slot 40. Then a comparison is made between the address requested 68 and the base address 56, 58 of the slot 40. The result of this comparison is the input signal to an OR gate 130 whose output 132 is the input to the control logic 70.

If a slot 40 has no SIMM 38 in it, the control signals 120-128 will not be asserted and the output 132 of the OR gate 130 will also not be asserted. Conversely, if the slot 40, has, for example, an 8 Mbyte SIMM 38 in it, then only the third comparator 94 will be enabled. Comparator 94 will compare the six high order bits of the requested address 68 with the six high order bits of the base address 56, 58. If the addresses match, the control logic 70 will receive a high output and slot 40, corresponding to these comparators 90-98 will be selected.

For example, assuming that address 01200000 is to be written to and that memory is configured with a 16 Mbyte SIMM having a base address of 00000000, a 4 Mbyte SIMM having a base address of 01000000 and a 2 Mbyte SIMM having a base address 01400000. Bits 28–21 for these SIMMs will be 00000000, 0001000, and 00001010, respectively. Bits 28–21 of the address will likewise be 00001001. Comparator 96 for the 16 Mbyte SIMM will be active but the SIMM will not be selected since the 5 high order bits of the address (00001) do not equal the 5 high order bits of the 16 Mbyte SIMM base address (00000). Similarly, for the 2 Mbyte SIMM comparator 90 is active but this SIMM will not be selected because the 8 high order bits of the address (00001001) do not equal the high order 8 bits of the 2 Mbyte SIMM base address (00001010). However, for the 4 Mbyte SIMM, comparator 92 is active and the 7 high order bits of the address (0000100) equals the 7 high order bits of the 4 Mbyte SIMM base address (0000100) and hence the 4 Mbyte SIMM is selected. Thus, if more than one SIMM has the same write base address, each of those SIMMs will be selected. This provides a convenient means for mirroring memory within the cache.

Figure 2:
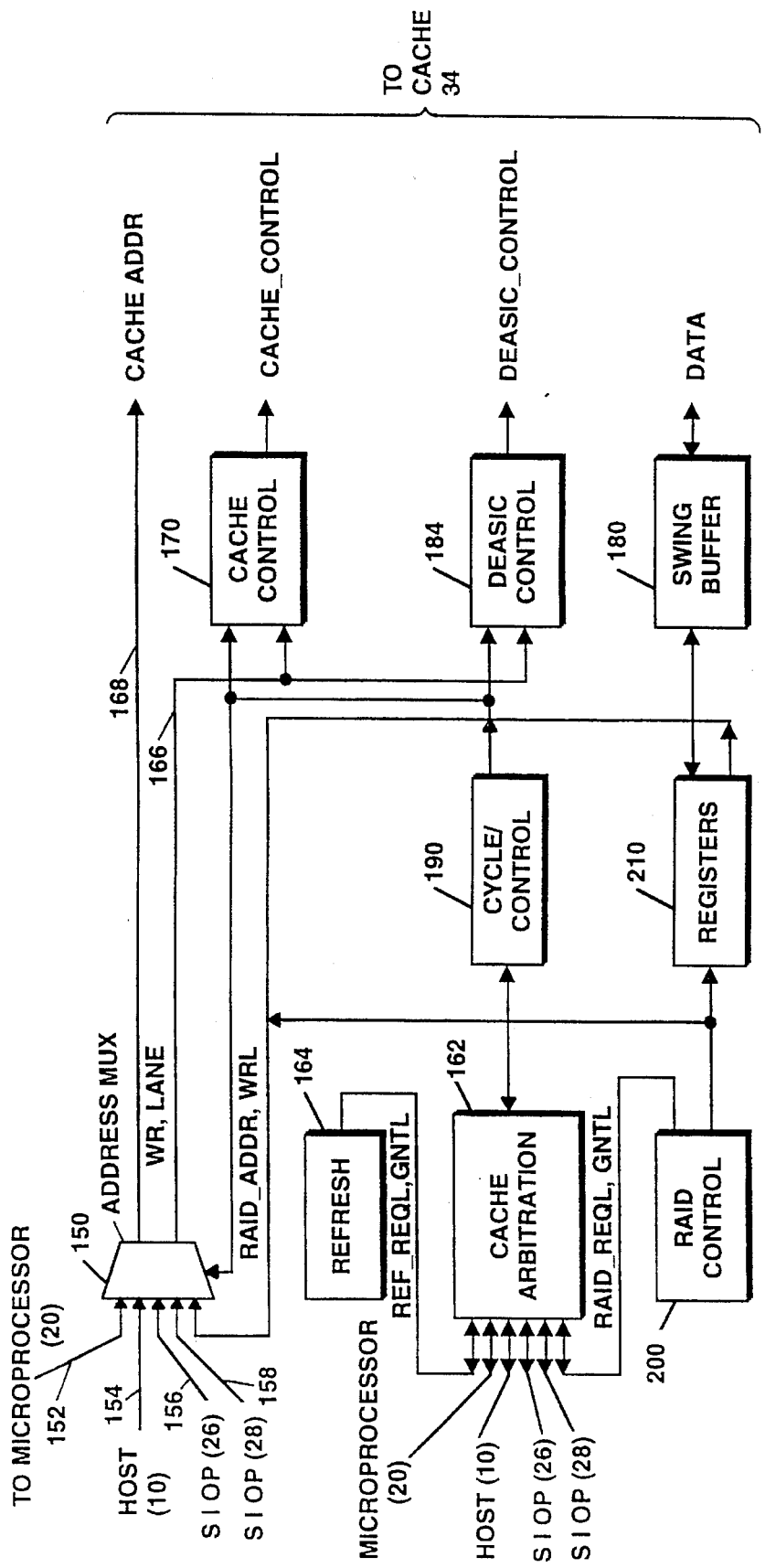
FIG. 2 is a functional block diagram of an embodiment of a flexible addressing controller of the invention.

A functional block diagram of an embodiment of a cache controller utilizing the flexible addressing controller of the invention is shown in FIG. 2. In this embodiment an address multiplexer (ADDRESS MUX) 150 performs the addressing and control multiplexing for five ports (from the microprocessor (20) 152, the host (10) 154, the SIOP (26) 156, the SIOP (28) 158, and RAID 160) to the cache 34 under the control of cache arbitration logic (ARBITRATION) 162. Based upon the signal from ARBITRATION 162, information from the port granted access to the cache 34 passes through the ADDRESS MUX 150.

A sixth port, from the SIMM refresh circuits (REFRESH) 164, does not pass through the ADDRESS MUX 150 but is still under the control of the ARBITRATION logic (162). Although arbitration is performed among the other five ports in a round robin fashion, the highest priority is given to REFRESH 164. In one embodiment, the REFRESH block 164 generates the refresh requests for the SIMM 38 of the cache memory 34 at a default interval of 15.25 sec. Upon power up, refresh is enabled for all SIMM memory. Refresh for nonvolatile SIMMs is turned off by the microprocessor 20 writing to the SETUP registers 50.

The output of the ADDRESS MUX 150 is control 166 and address information 168 which is passed to the cache controller (CACHE CONTROL) 170 and the cache memory 34, respectively. The CACHE CONTROL 170 generates the appropriate row address strobe (RAS), column address strobe (CAS) and write enable (WE) signals for the cache 34.

A buffer (SWING BUFFER) 180 is a bidirectional bus which translates a 32 bit internal data bus of the cache controller 22 to an eight bit bus which communicates with a DEASIC CONTROL 184. The DEASIC CONTROL 184 implements all of the data bus multiplex functions, the data registers for the RAID machine, the logic for performing the XOR function on the data and parity and parity generation and checking circuitry. A CYCLE/CONTROL block 190 is the state machine which generates all the control signals for the other blocks based upon the port granted access to the cache or registers, the type of SIMM at the location in cache and the existence of any error condition.

The RAID controller (RAID CONTROL) 200 is also a state machine that controls RAID hardware assisted functions, such as direct memory access DMA. Finally, the register block (REGISTERS) 210 contains the address relates registers used by the other blocks.

Figure 2A:
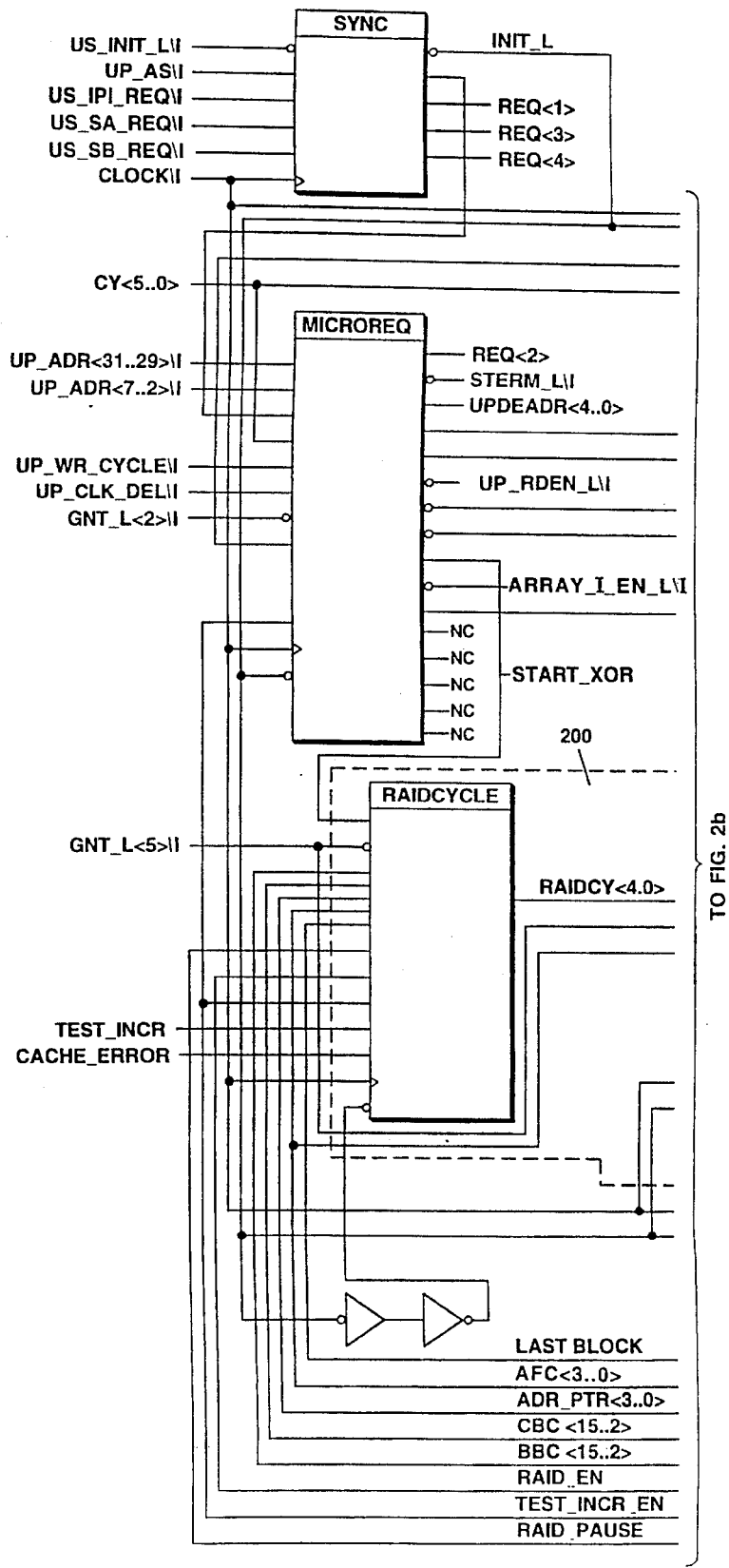
FIGS. 2a and 2c are a logic diagram of the embodiment of the flexible addressing controller of the invention shown in FIG. 2.
Figure 2B:
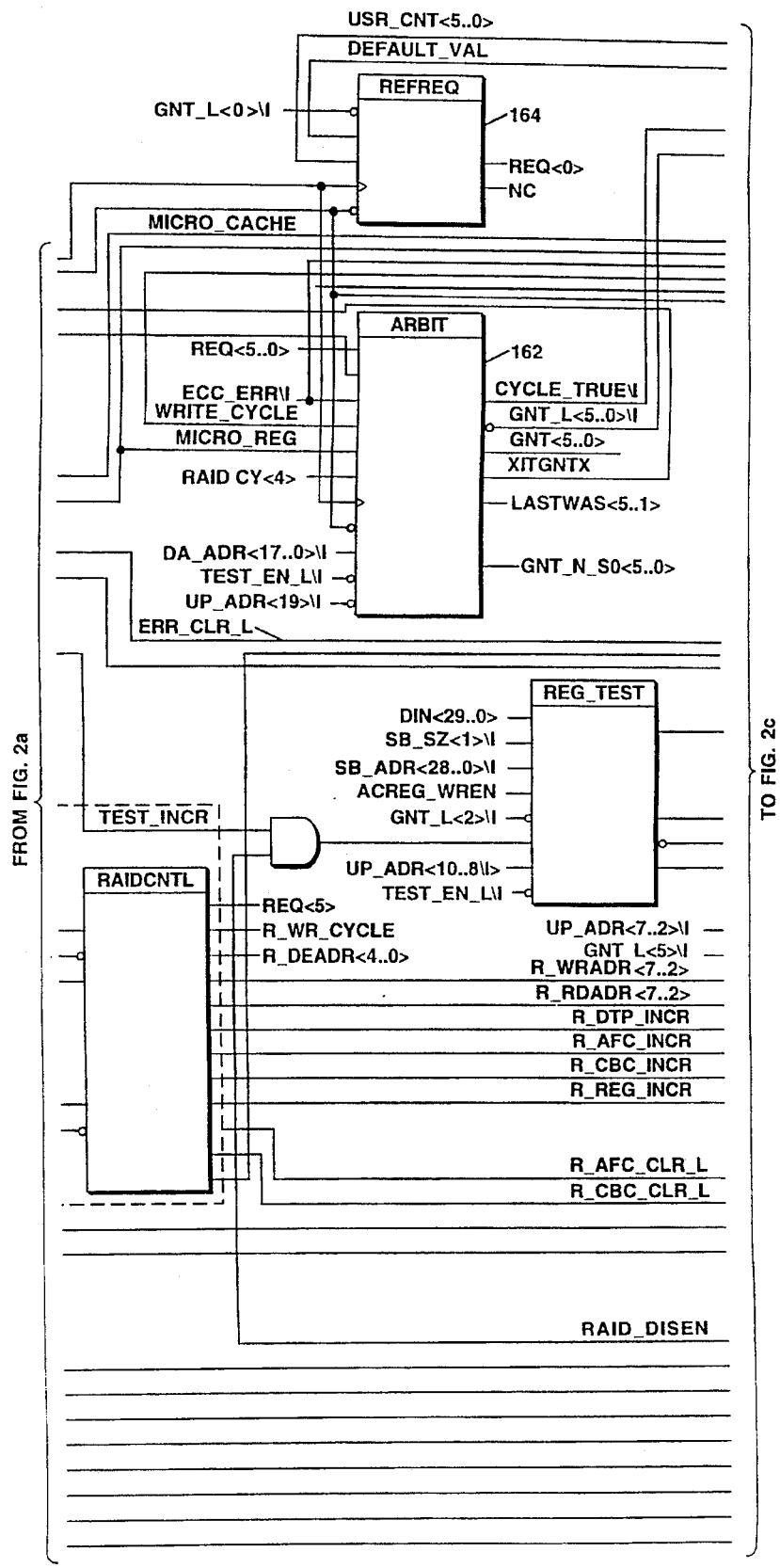
Figure 2C:
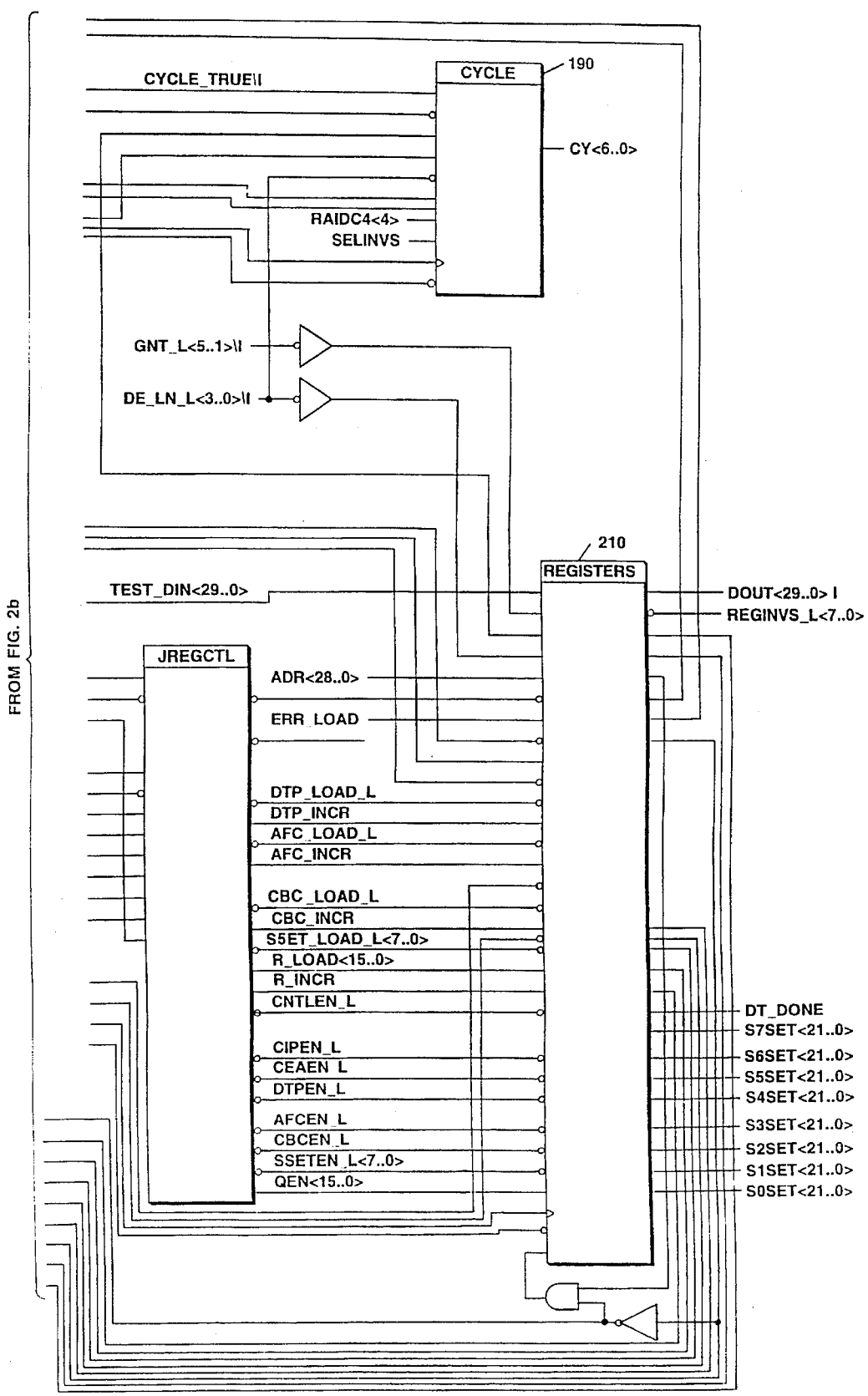
Figure 3A:
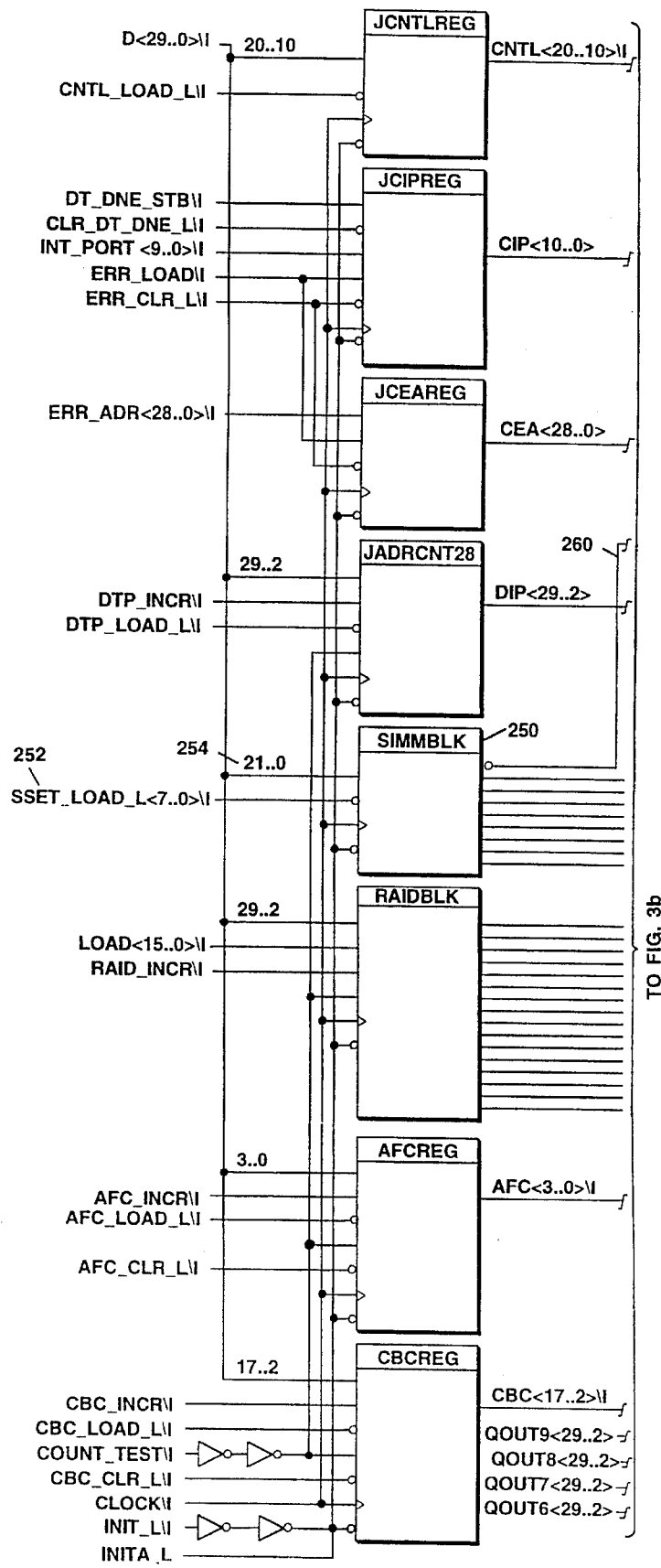
FIGS. 3a and 3b is a logic diagram of an embodiment of a register logic block of the flexible addressing controller shown in FIGS. 2a–2c.
Figure 3B:
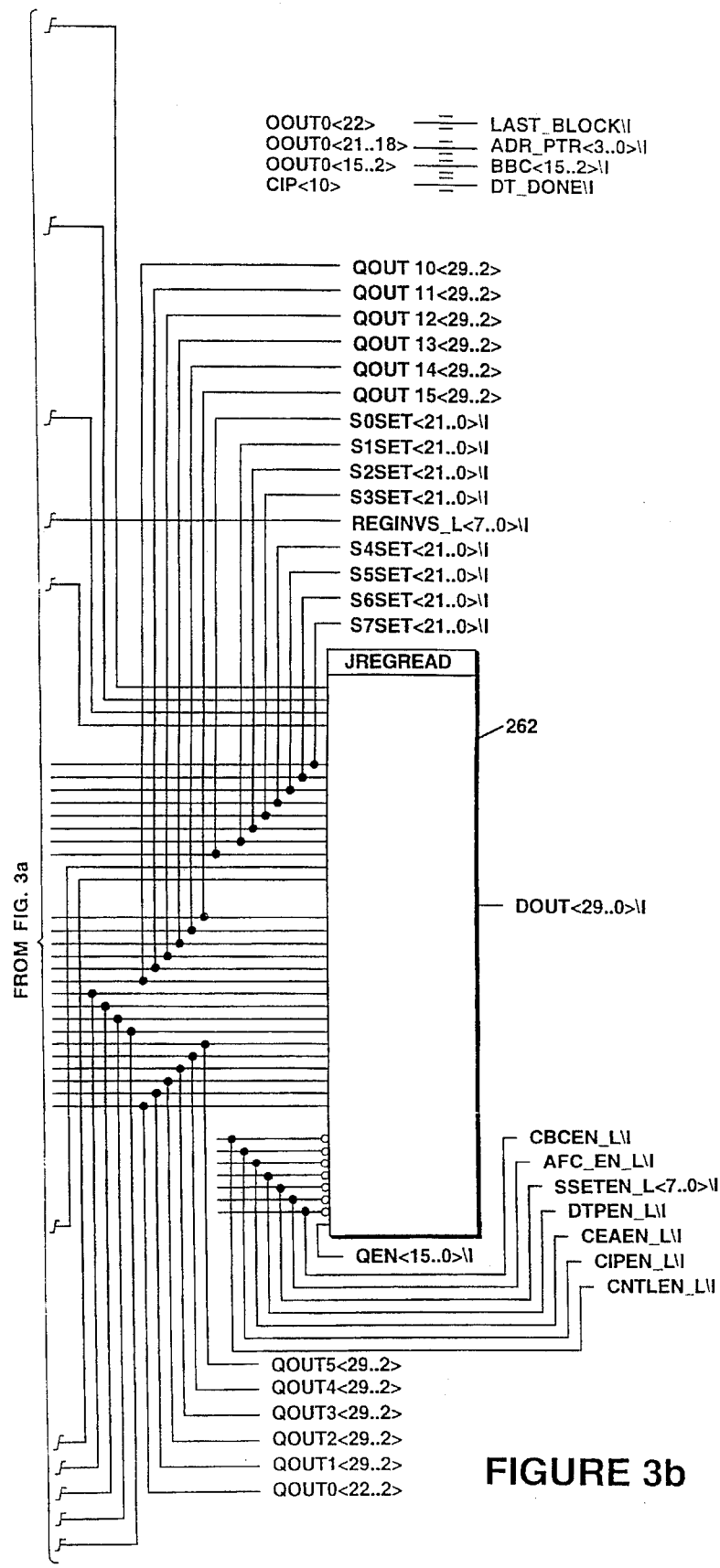

FIGS. 2a–2b depict a logic level diagram of an embodiment of the functional diagram shown in FIG. 2. FIGS. 3a and 3b logic diagram of an embodiment of the register logic block entitled JREG shown in FIGS. 2a–2c. The register logic block includes a SIMM block (SIMBLK) 250 which holds 8 setup registers. A decoded strobe 252 allows one of the eight setup registers to be loaded from the 22 bit data path 254. One bit 260 of the SIMBLK 250 output, when set, indicates that a non-volatile SIMM is in the slot. A data multiplexer 262 functions as a read back register for the microprocessor 20.

Figure 4:
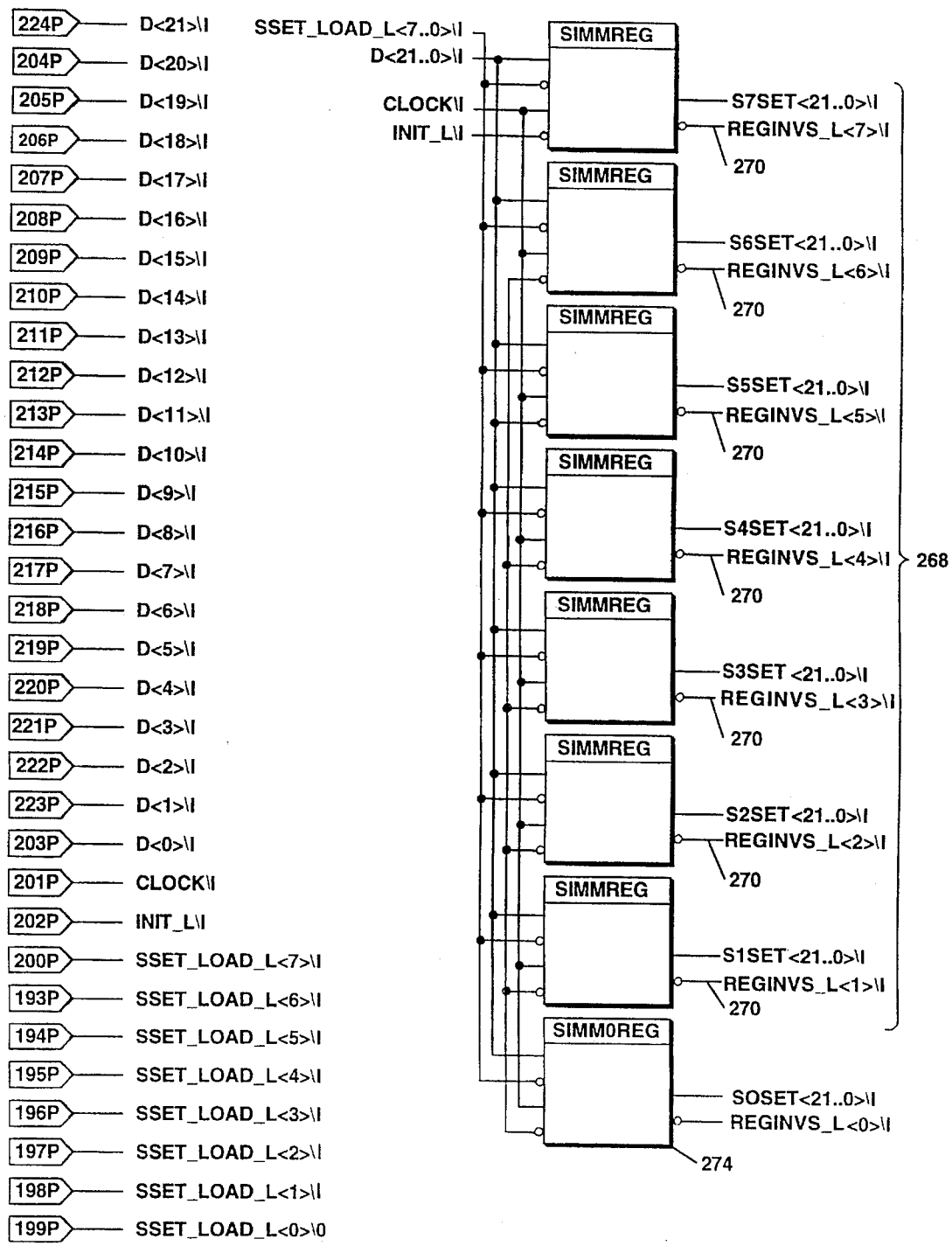

FIGS. 4–4d is a logic diagram of an embodiment of eight single inline memory module (SIMM) setup registers of the SIMBLK 250 of FIGS. 3a and 3b. Seven 268 of the SIMM setup registers are identical and default to the unpopulated condition. Identifier output 270 of each SIMM setup register is set low if the corresponding memory slot contains a non-volatile SIMM. The last SIMM setup register 274 defaults to a 4 Mbyte volatile SIMM.

Figure 5:
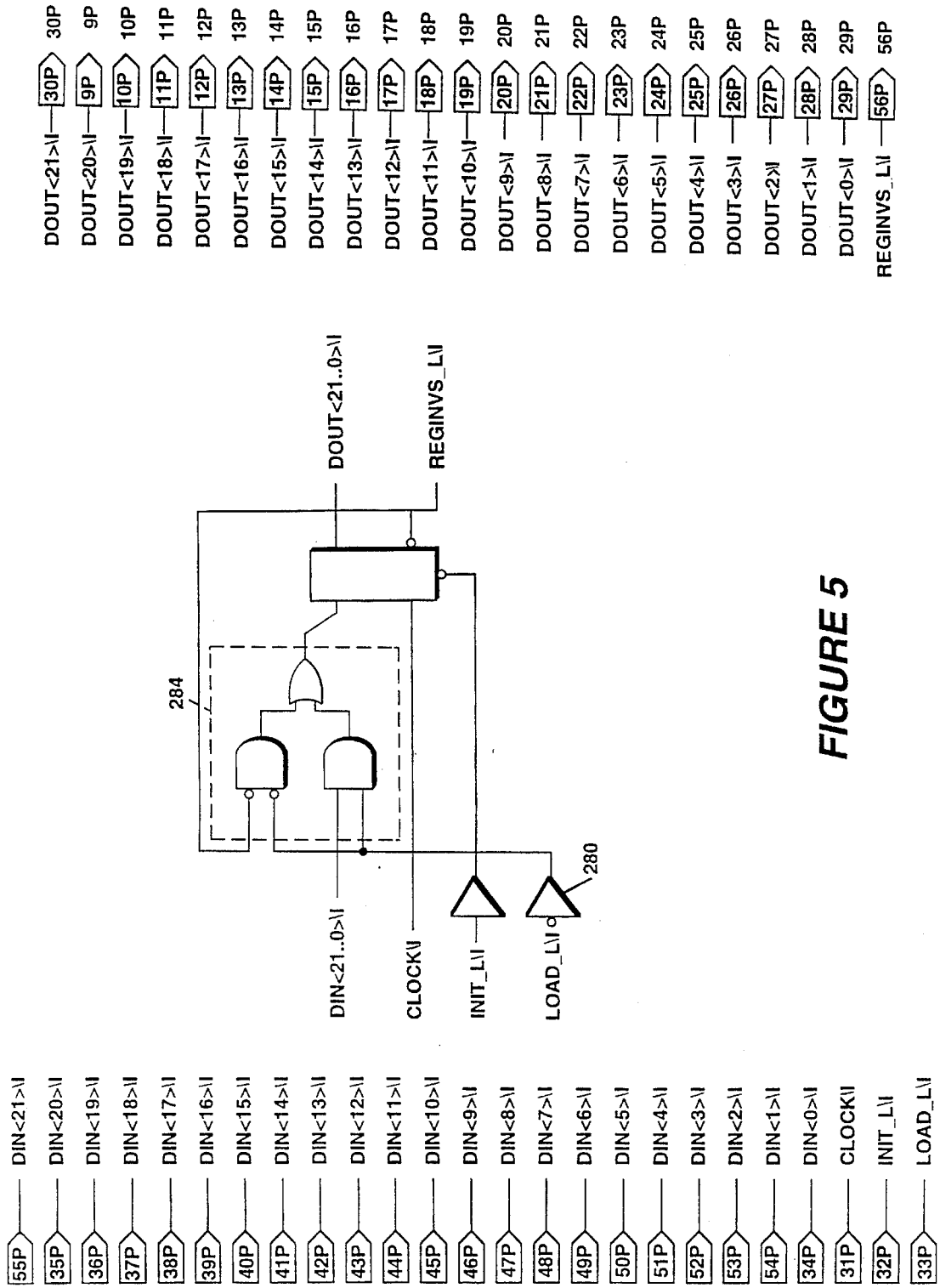
FIG. 5 is a logic diagram of an embodiment of an individual SIMM register of seven of the SIMM registers shown in FIGS. 4–4d.
Figure 6:
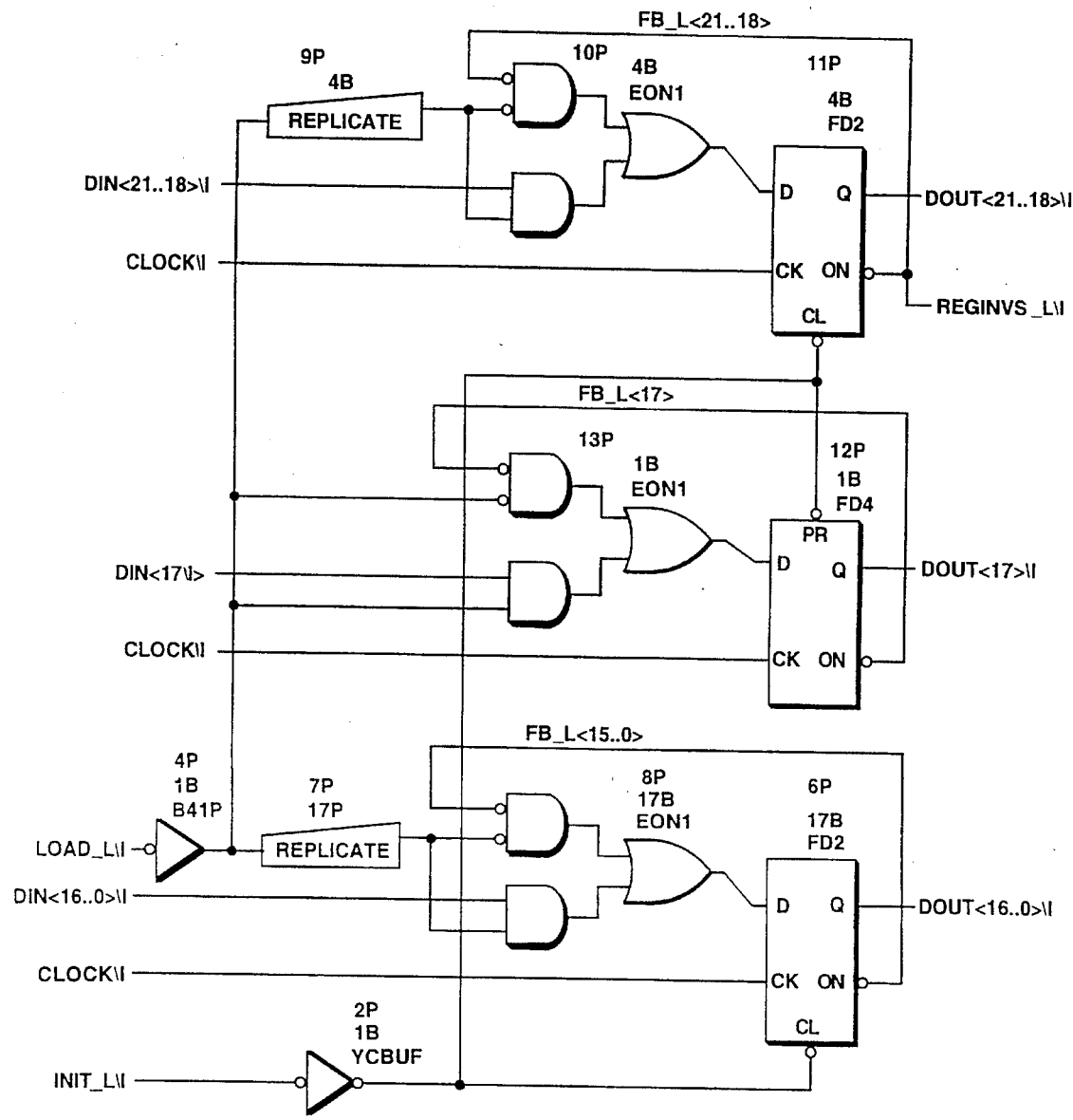
FIG. 6 is a logic diagram of an embodiment of individual SIMM register zero of the eight SIMM registers shown in FIGS. 4–4d.

FIG. 5 is a logic diagram of an embodiment of an individual SIMM register 268 of the eight SIMM registers shown in FIGS. 4–4d. The multiplexer 284 and the register element 285 shown, are replicated 22 times and a single driver 280 provides a common select input to all multiplexes 284 in the register 268. Similarly, FIG. 6 is a logic diagram of an embodiment of the individual SIMM register zero 264 of the eight SIMM registers shown in FIG. 4–4d.

Figure 2D:
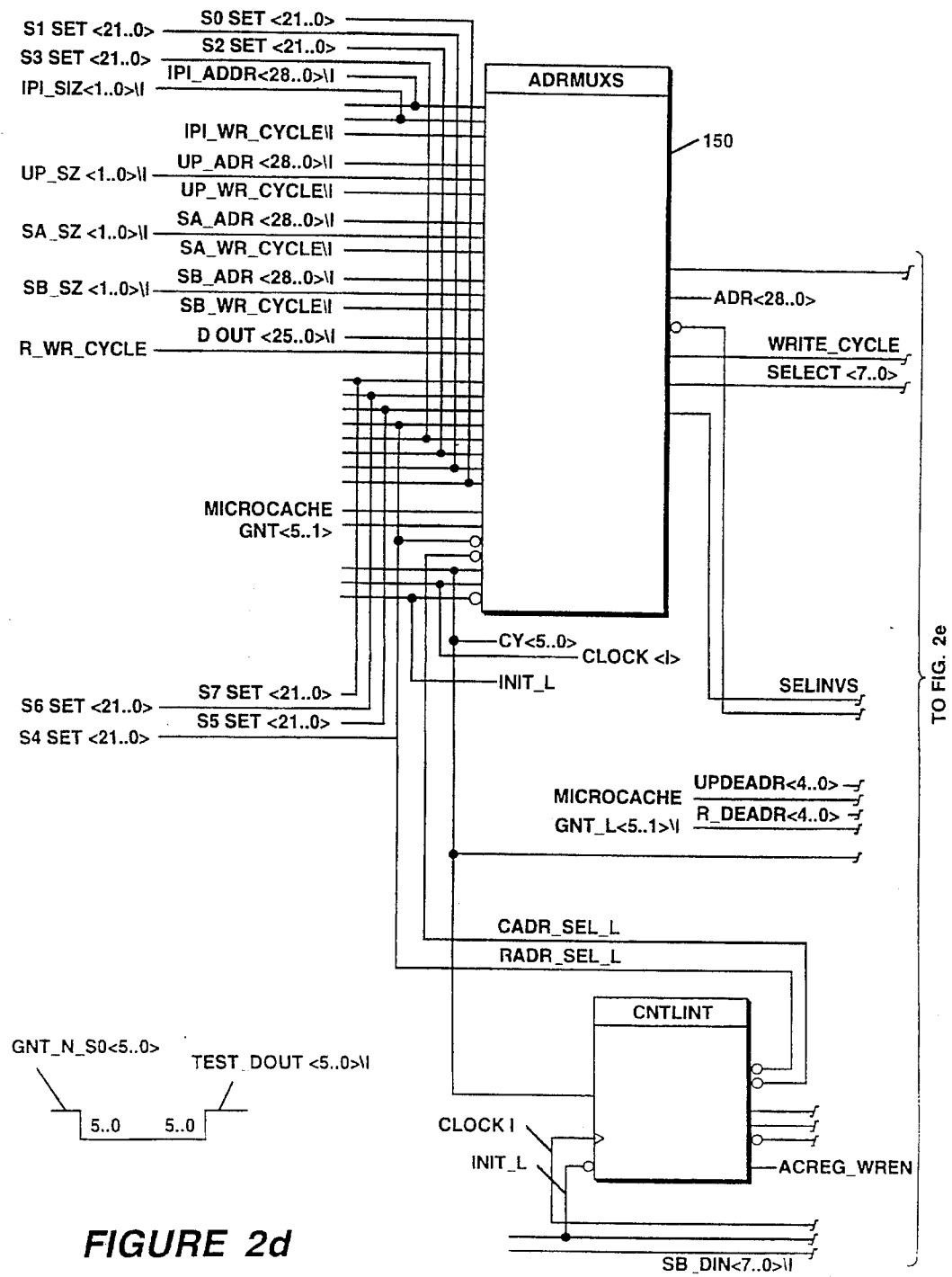
Figure 2E:
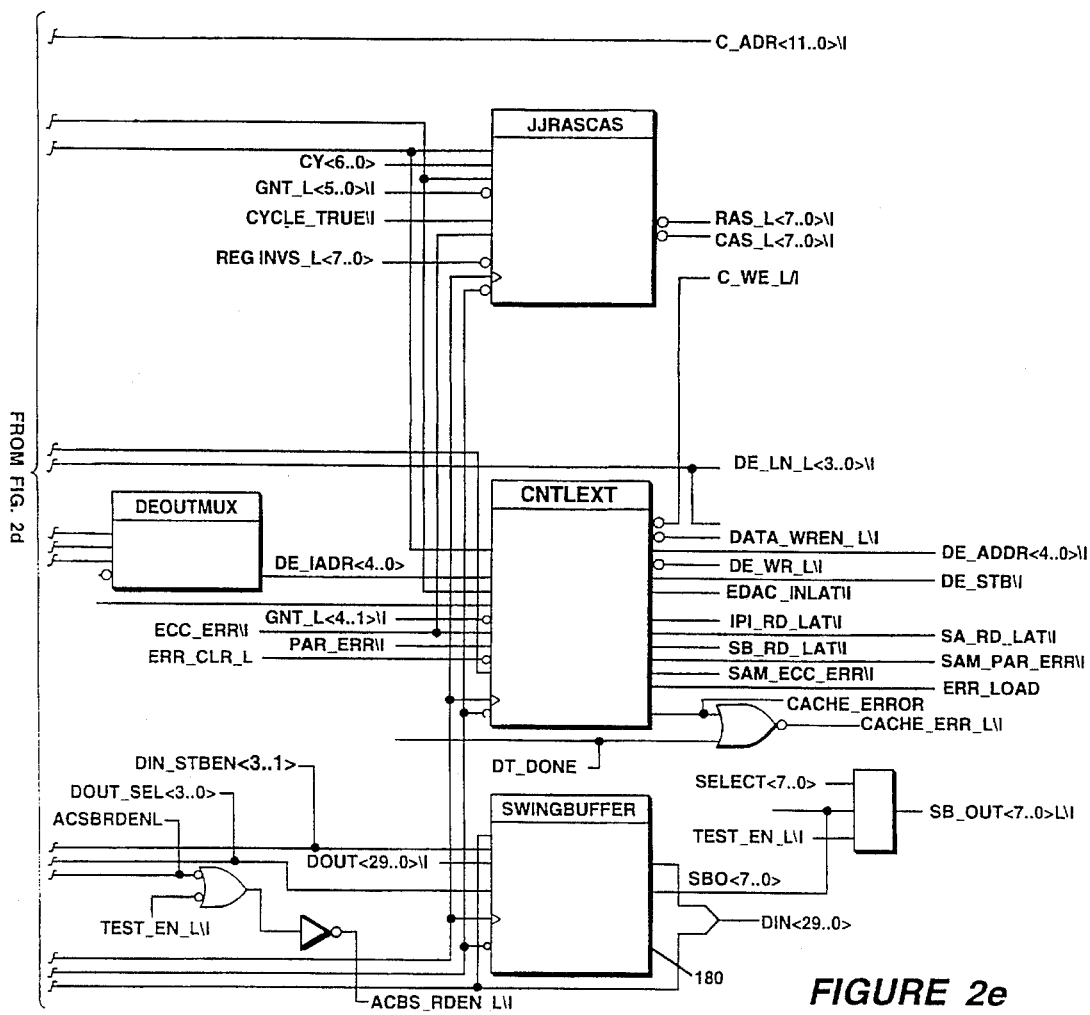
Figure 7A:
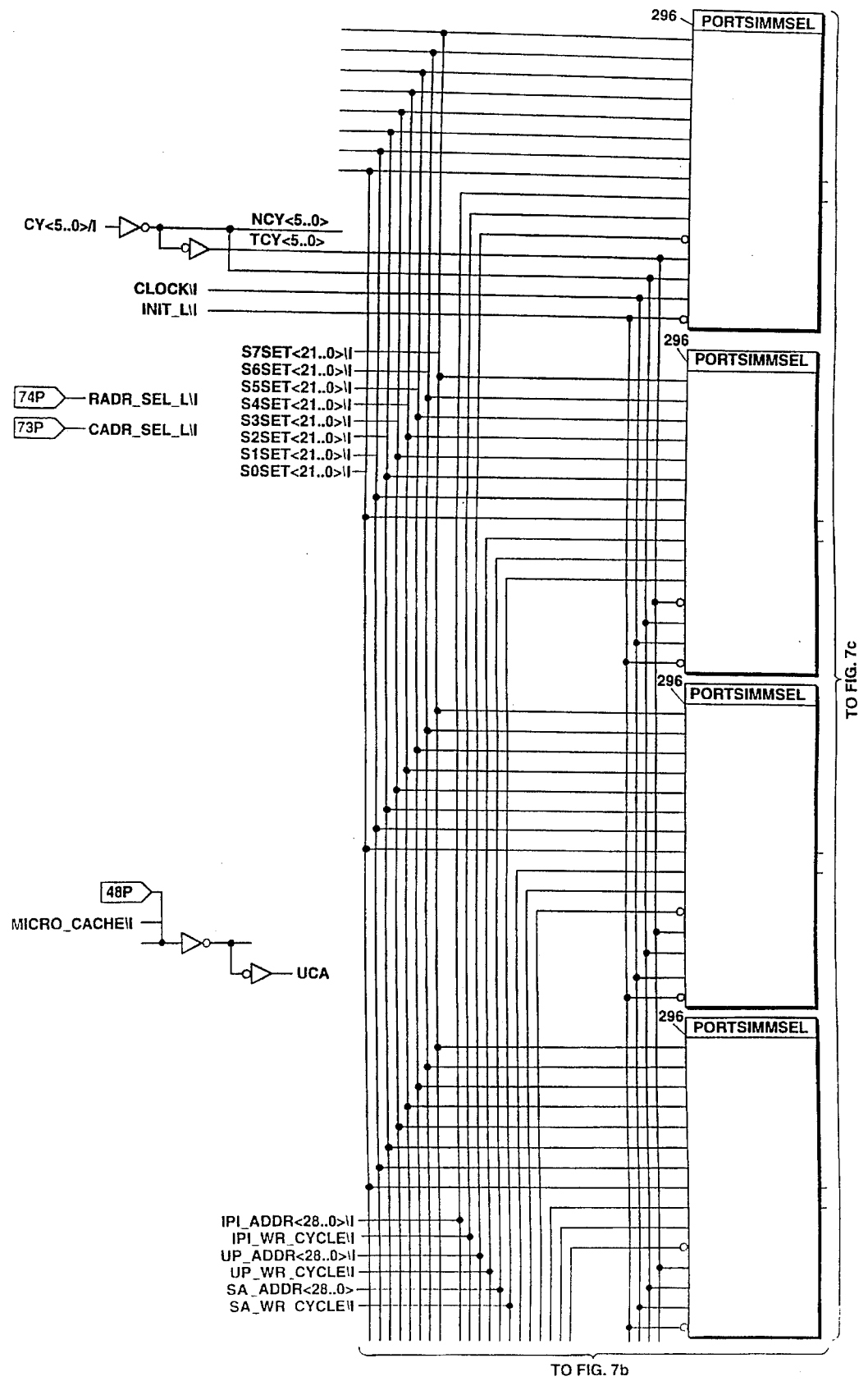
FIGS. 7a–7d is a logic diagram of an embodiment of an address multiplexer logic block shown in FIGS. 2d–2c.
Figure 7B:
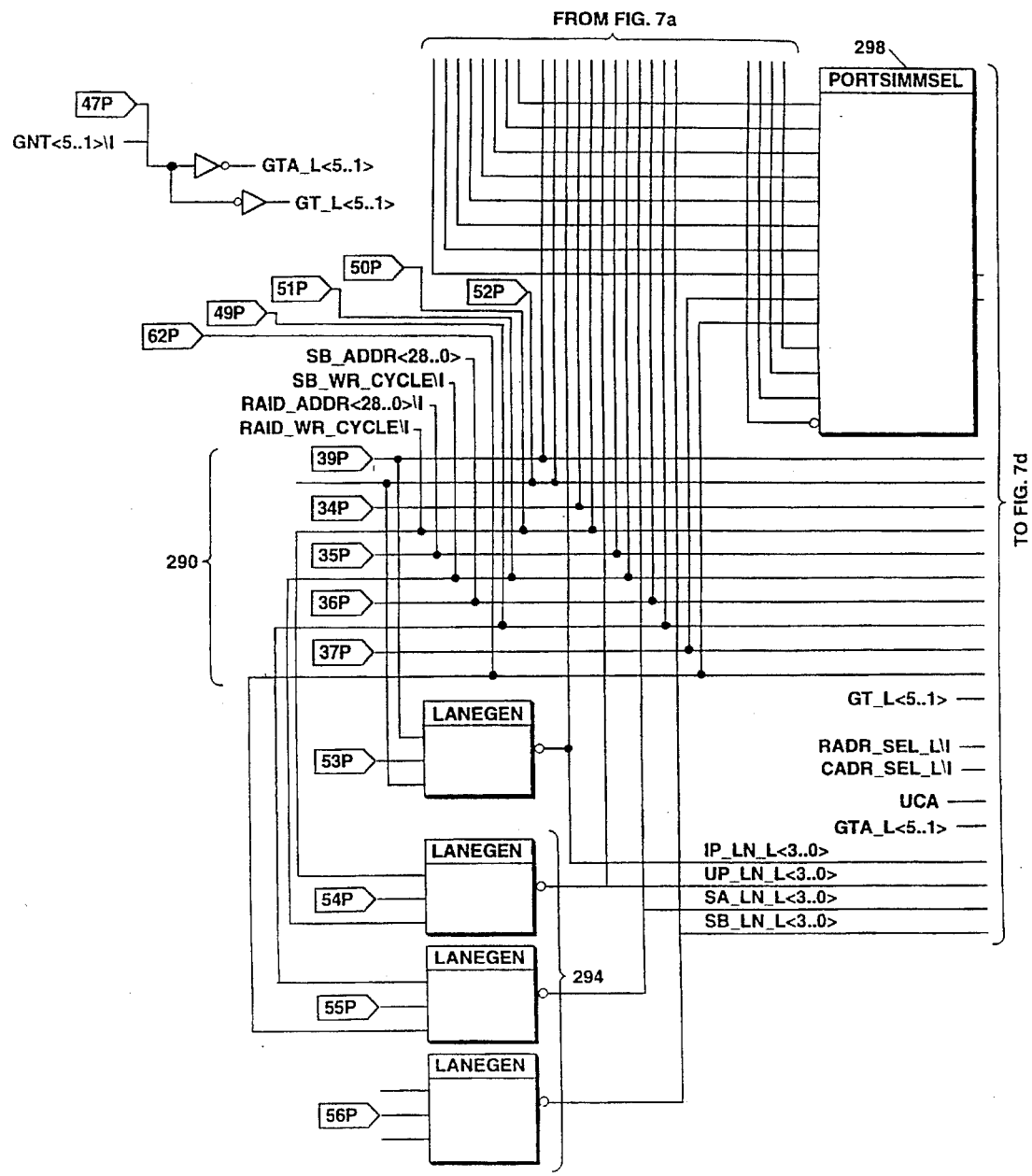

FIGS. 7a and 7b is a logic diagram of an embodiment of the address multiplexer logic block 150 shown in FIG. 2d. Address and control lines 290 provide address and control information from the individual ports (where IPI designates SIOP 26, SA designates SIOP 27 and SB designates the host 10). A series of four decoders 294 provide active byte lane information for the ports 290. The address multiplexer 150 includes four port SIMM selectors (PORTSIMSEL) 296 and one port five SIMM select (PORT5SIMSEL) 298 each of which contains eight comparators.

Figure 8A:
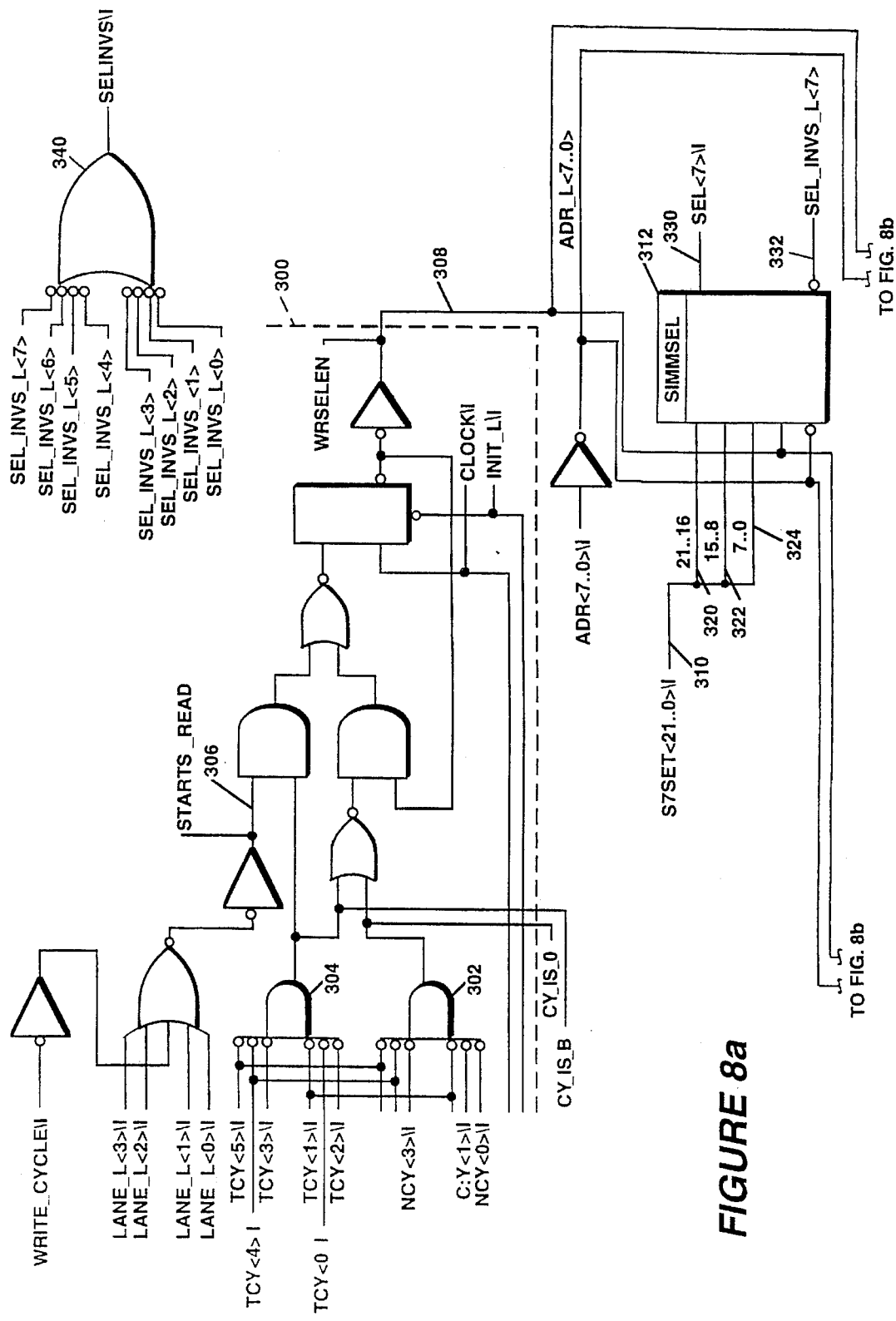
FIGS. 8a and 8b is a logic diagram of an embodiment of a port SIMM select logic block of the address multiplexer shown in FIGS. 7a–7d.
Figure 8B:
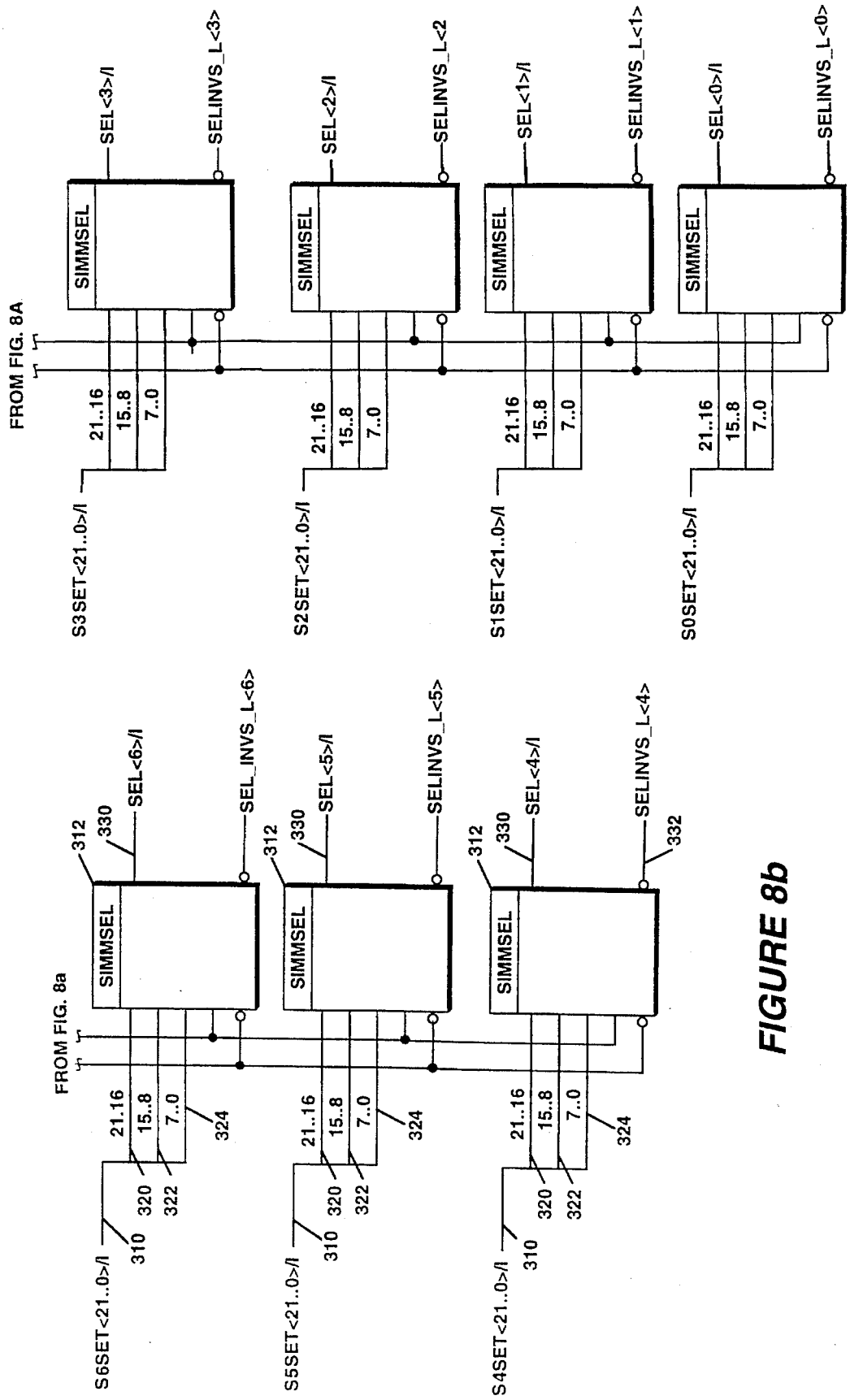

FIGS. 8a and 8b is a logic diagram of an embodiment of one port SIMM selector 296 shown in FIG. 7a. A selection circuit 300 determines whether the write or the read base address is to be used for SIMM selection. Gate 302 is used to determine the point in the read cycle at which it is safe to change addresses. The output signal from gate 304 starts the process when the state machine is in the idle state. If the write cycle is less than four bytes wide, the write starts as a read, and this is indicated by a signal 306. In the embodiment shown the output 308 is asserted when the write base address is to be used. The input signals 310 to the SIMM selection logic 312 are from the register output signals. In particular, input signals 320 select the size and type of SIMM, signals 322 select the read base address and signals 324 select the write base address. One output signal 330 from the selected SIMM select logic 312 enables generation of the RAS/CAS signals to the selected memory slot. A second output signal 332 provides a flag via gate 340 to the state machine, indicating that a non-volatile SIMM has been selected.

Figure 9A:
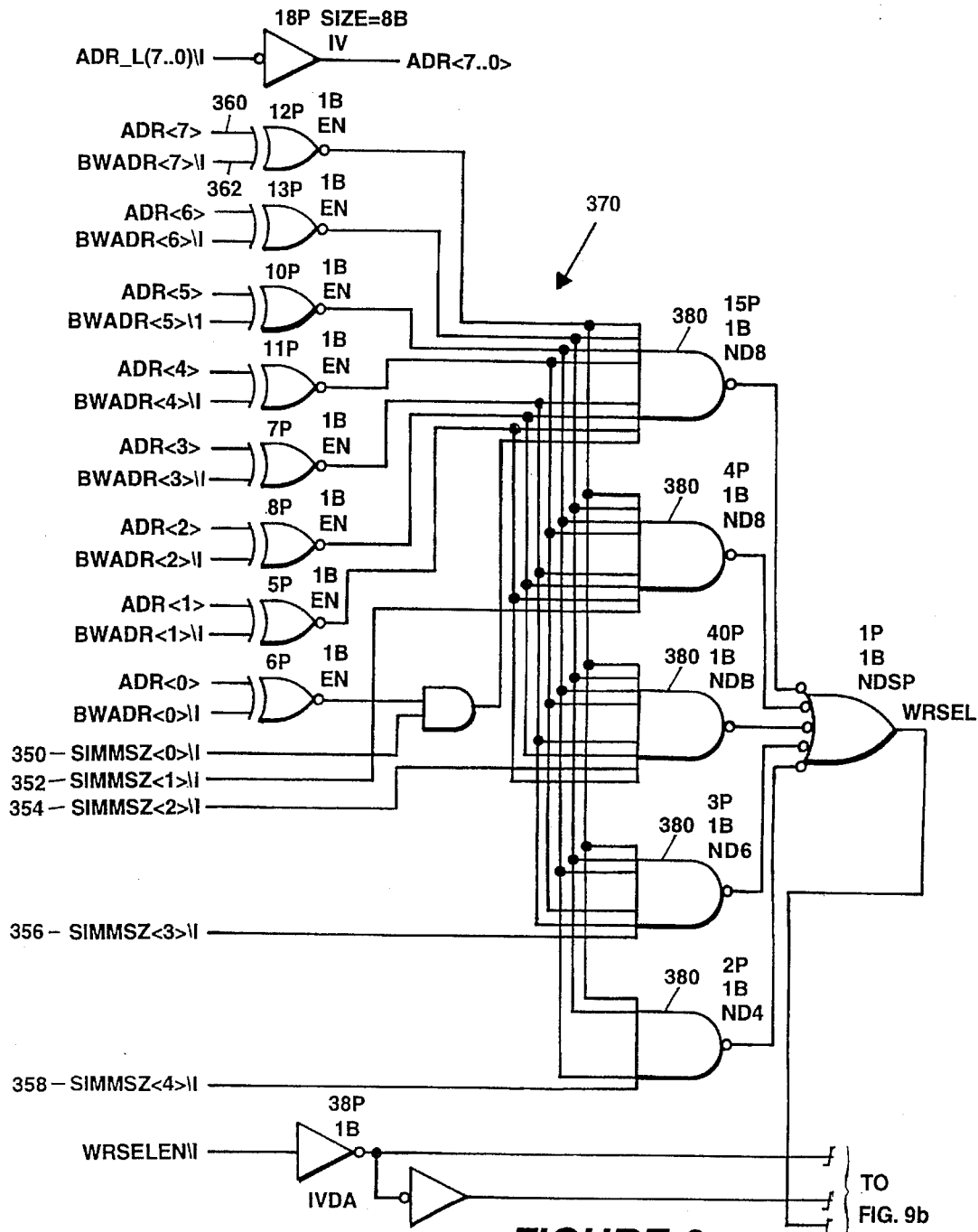
FIGS. 9a and 9b is a logic diagram of an embodiment of an individual SIMM select block of the port SIMM select block shown in FIGS. 8a and 8b.
Figure 9B:
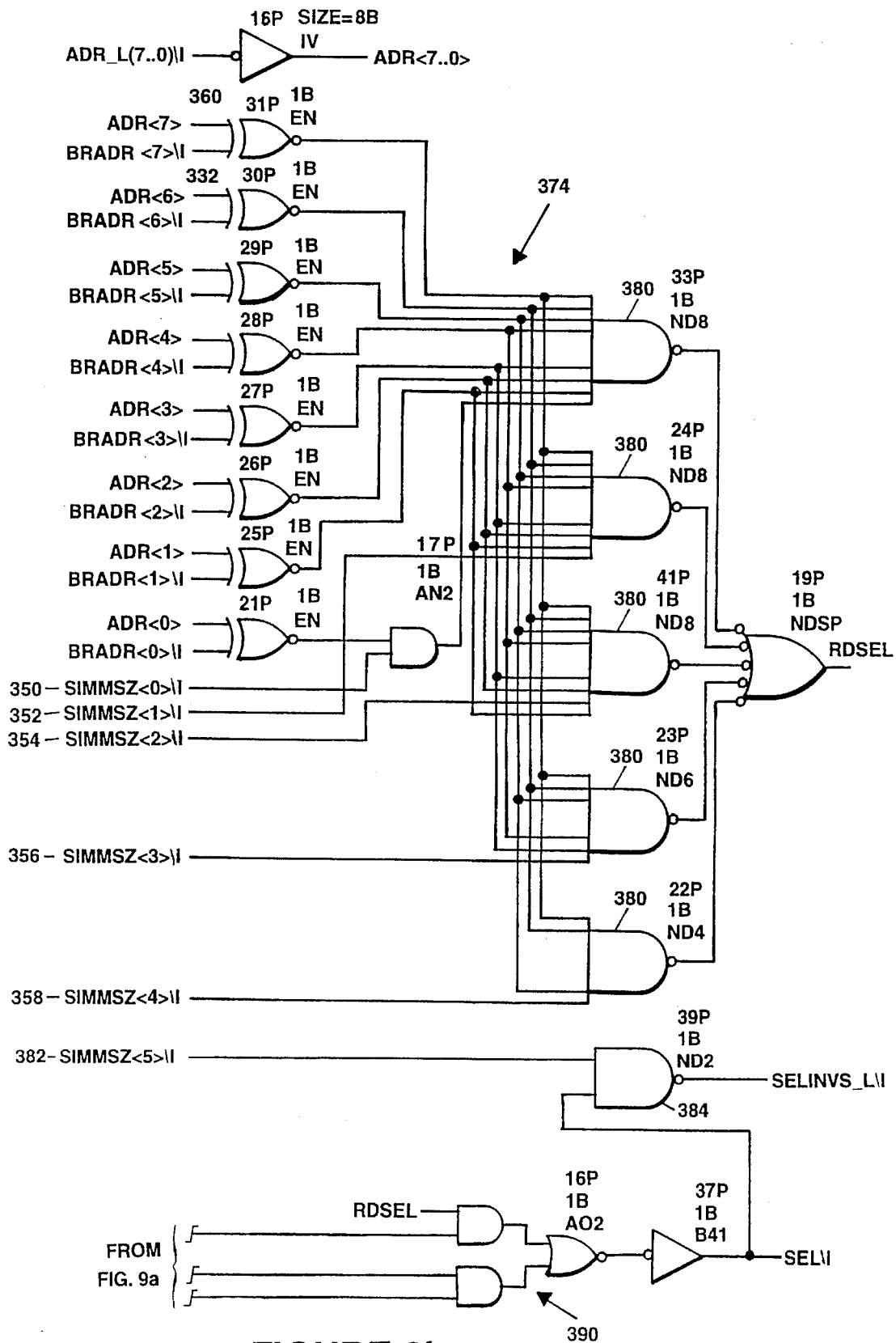
Figure 10A:
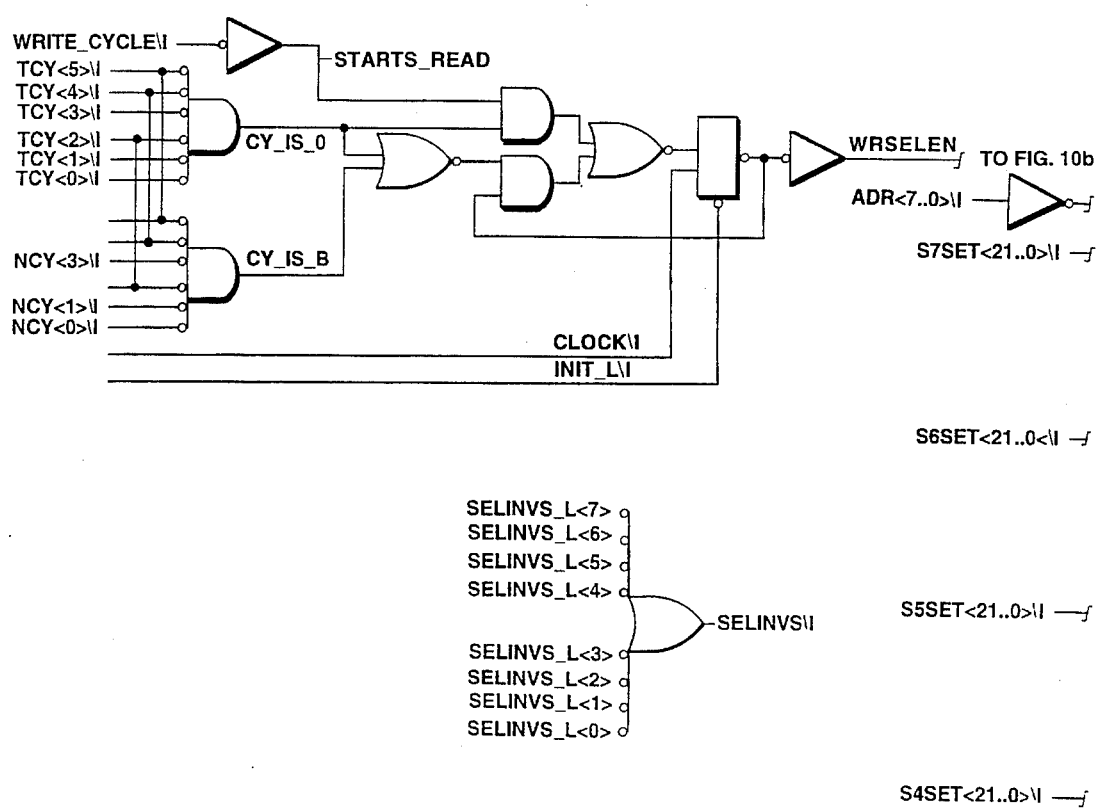
FIGS. 10a and 10b a is a logic diagram of an embodiment of a fifth port SIMM select block of the port SIMM select block shown in FIGS. 8a and 8b.
Figure 10B:
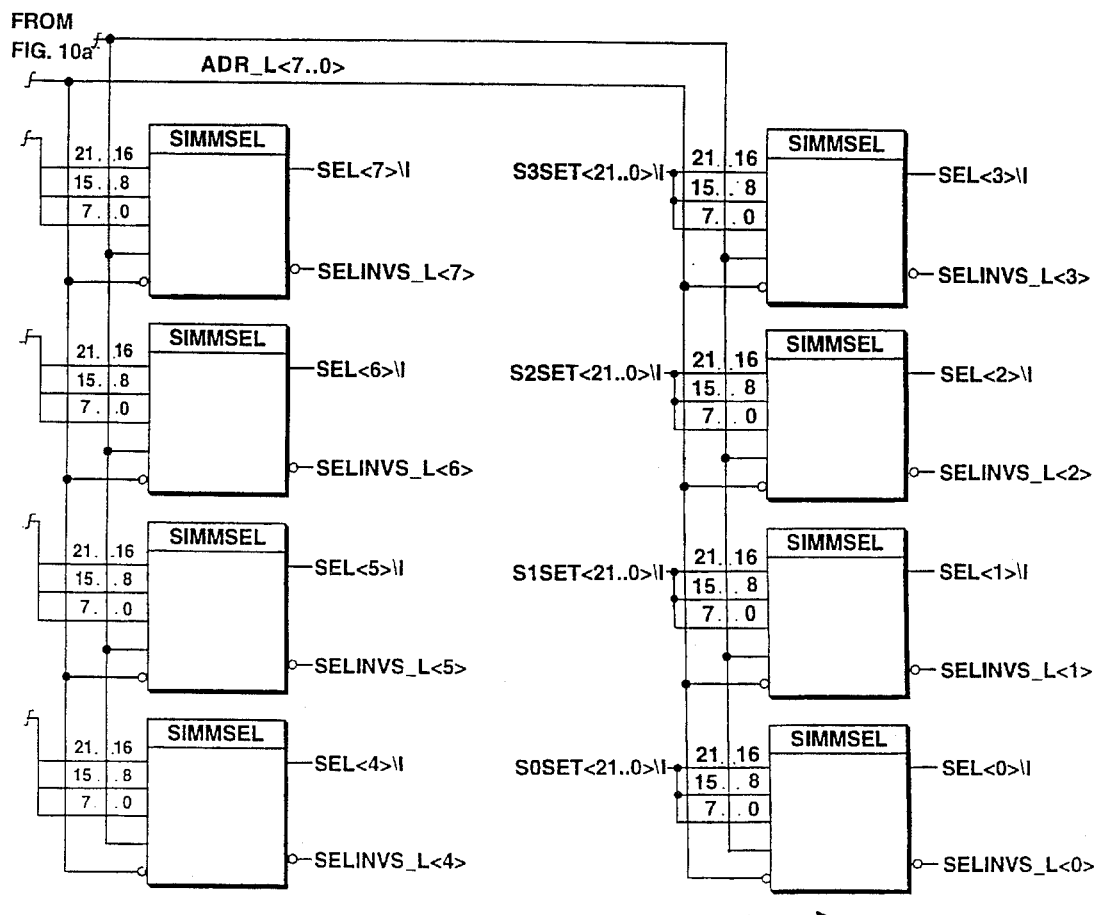

FIGS. 9a and 9b is a logic diagram of an embodiment of an individual SIMM select block 312 shown in FIGS. 8a and 8b. Each block is a series of comparators. A signal on only one of lines 350, 352, 354, 356, 358 is enabled to select the size of the SIMM as 2 Mbytes, 4 Mbytes, 8 Mbytes, 16 Mbytes and 64 Mbytes respectively. The address 360 is bitwise XOR'd 370 with write base address 362 or 374 with the read base address 372. As a result of the comparison the output of only one or less NAND gate 380 will be asserted for each of circuits 370, 374. Logic 390 determines whether the write comparison 370 or the read comparison 374 is to be passed. A non-volatile flag 382 as well as the output of logic 390 are the inputs to a NAND gate 384 whose output goes to the state machine. Similarly, FIGS. 10a and 10b is a logic diagram of an embodiment of a fifth port SIMM select block 298 shown in FIG. 7d, for which writes of less than 32 bits are not supported.

Figure 7C:
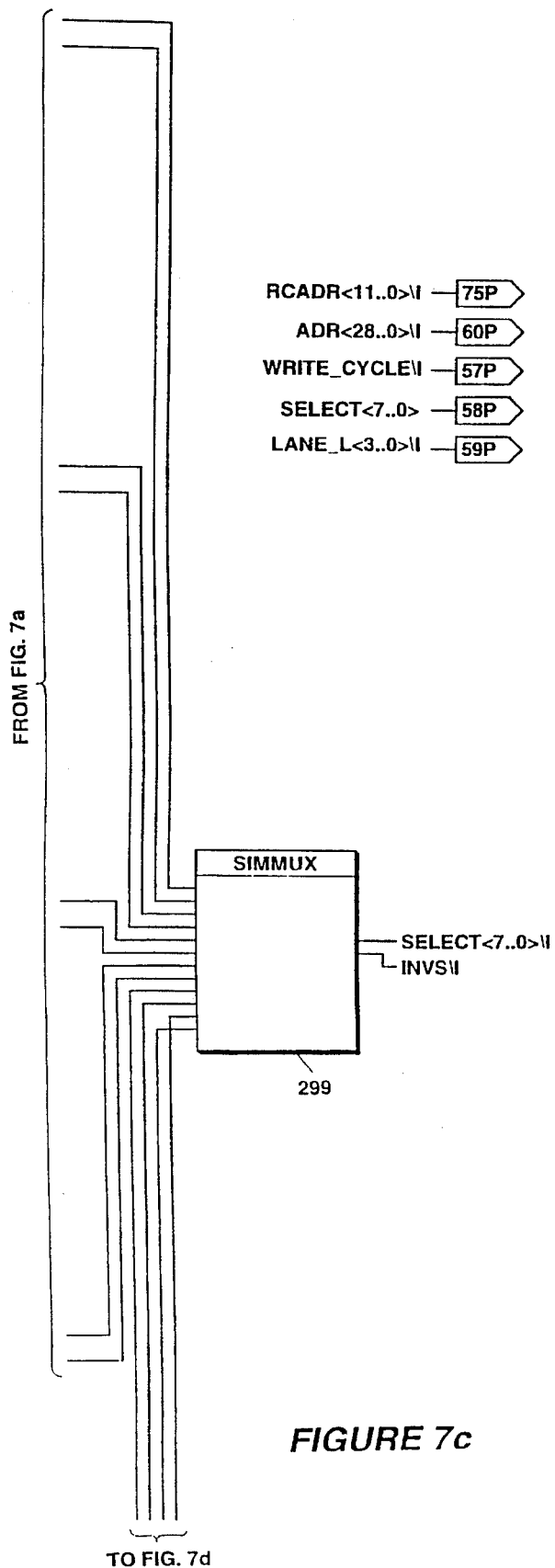
Figure 7D:
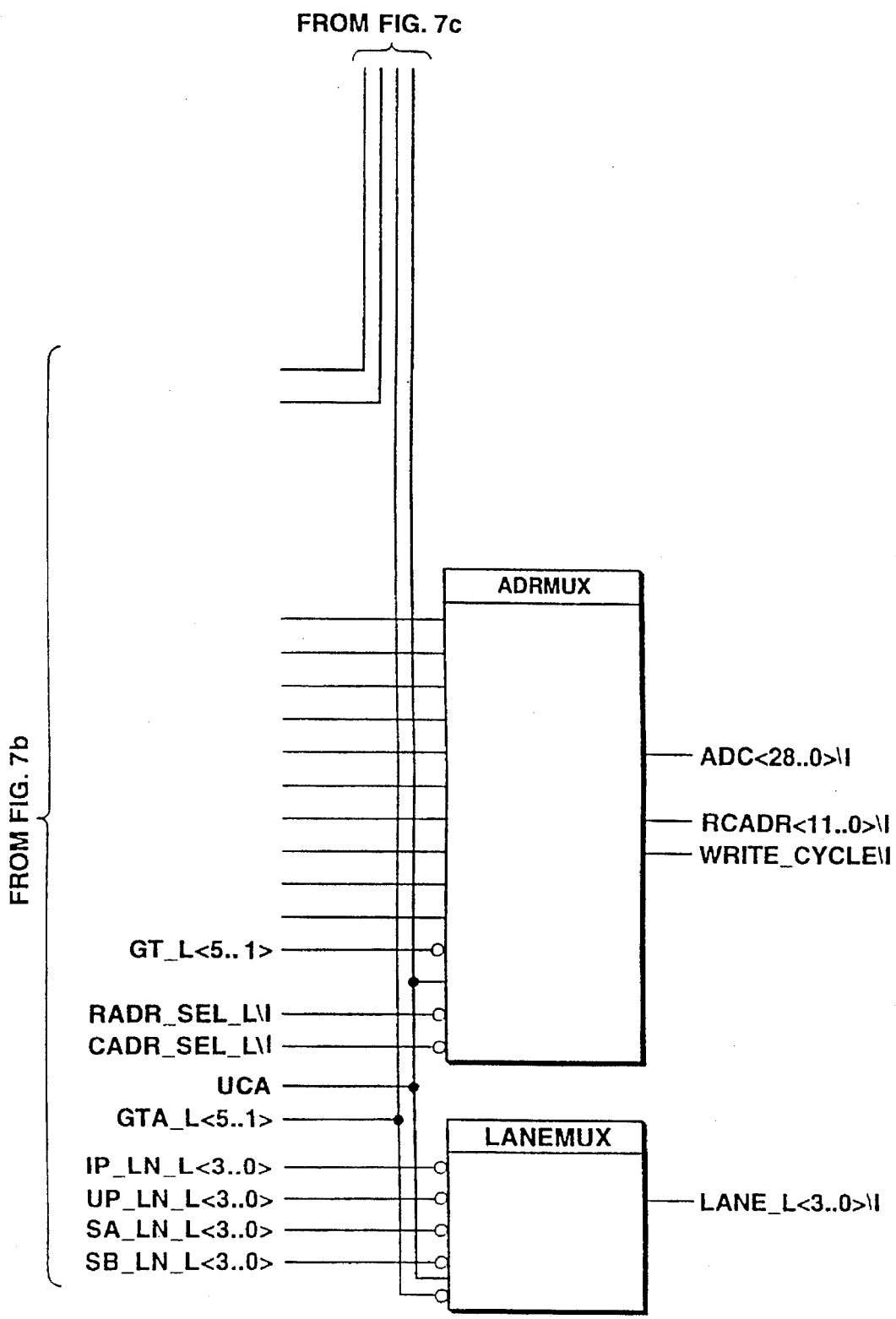
Figure 11A:
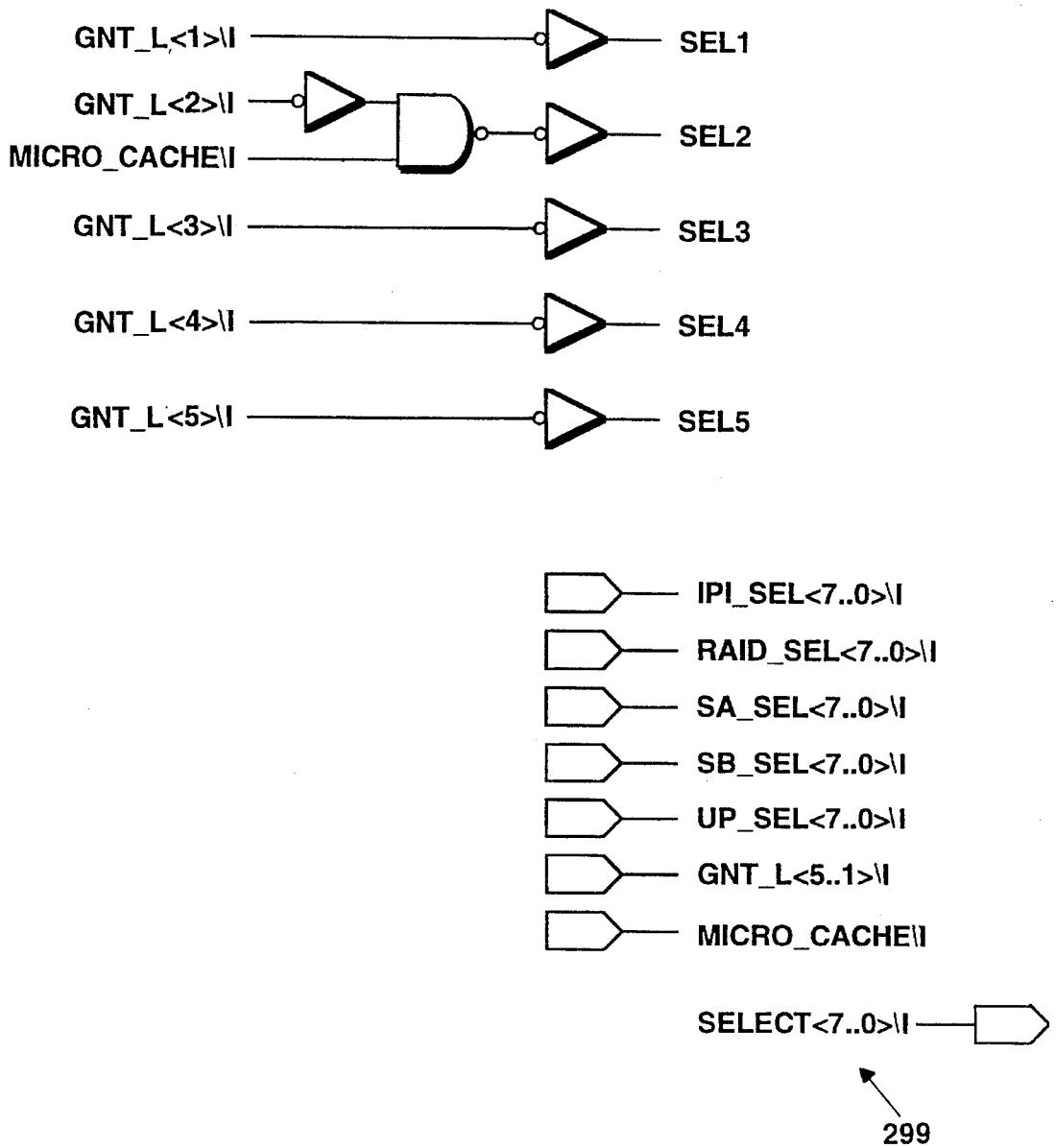
FIG. 11a–11c is a logic diagram of an embodiment of a SIMM select multiplexer block of the address multiplexer shown in FIGS. 7a–7b.
Figure 11B:
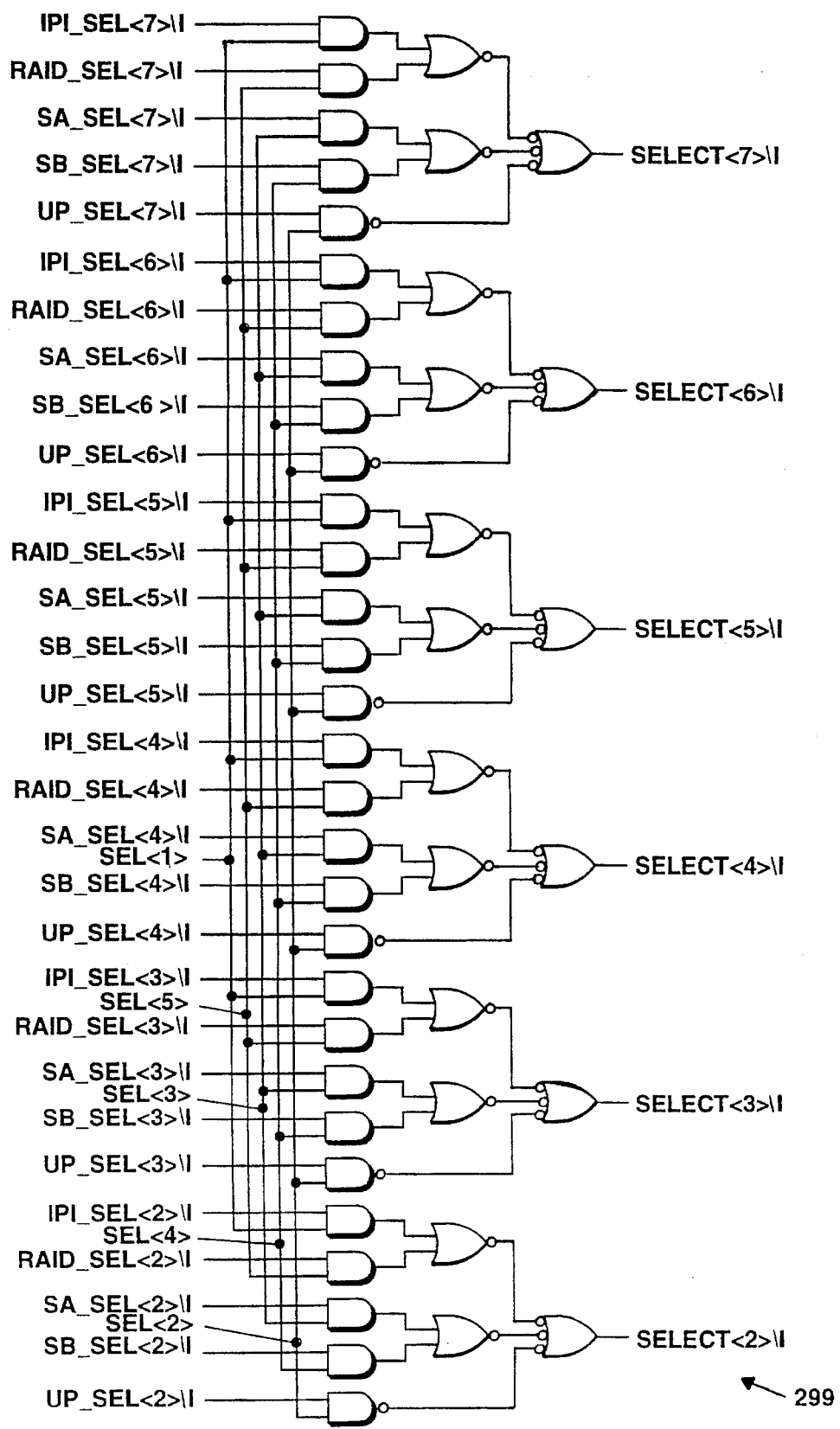
Figure 11C:
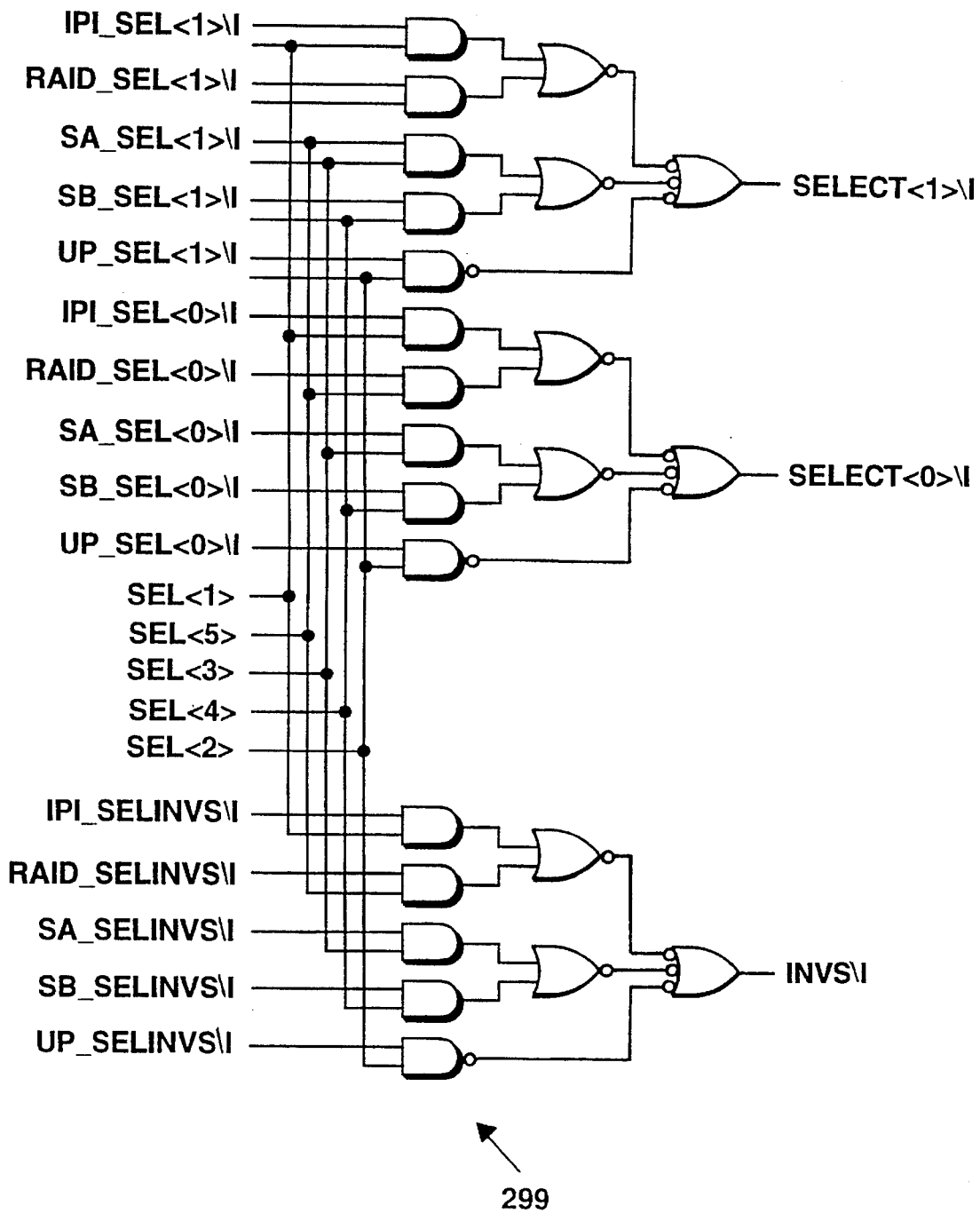

FIGS. 11a–11c is a logic diagram of an embodiment of a SIMM select multiplexer block 299 shown in FIG. 7c.

Figure 12:
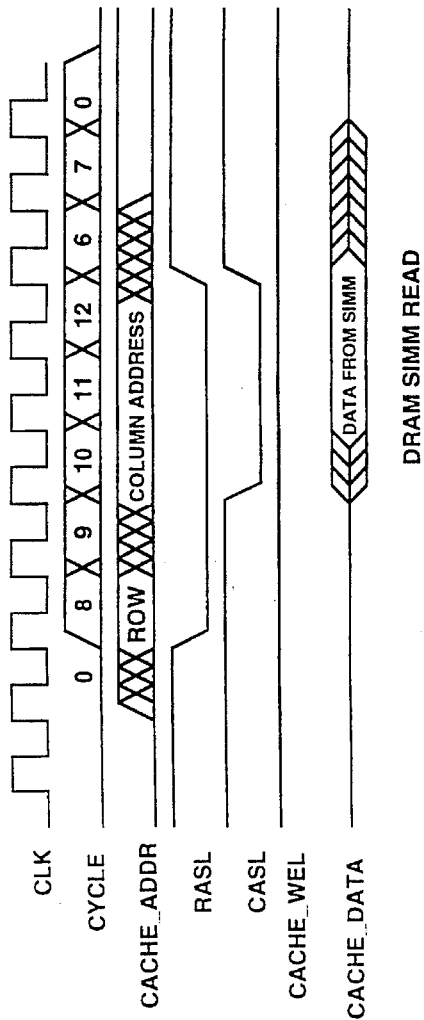
FIGS. 12–12i are timing diagrams for the embodiment of the invention shown in FIGS. 2a and 2b.
Figure 12A:
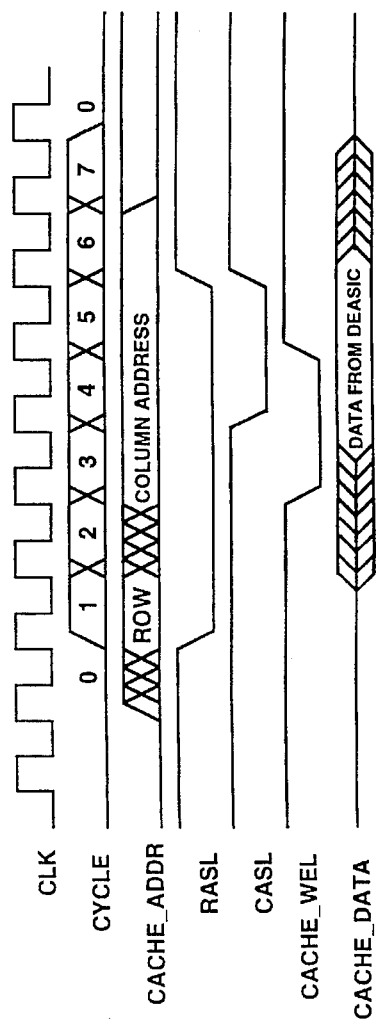
Figure 12B:
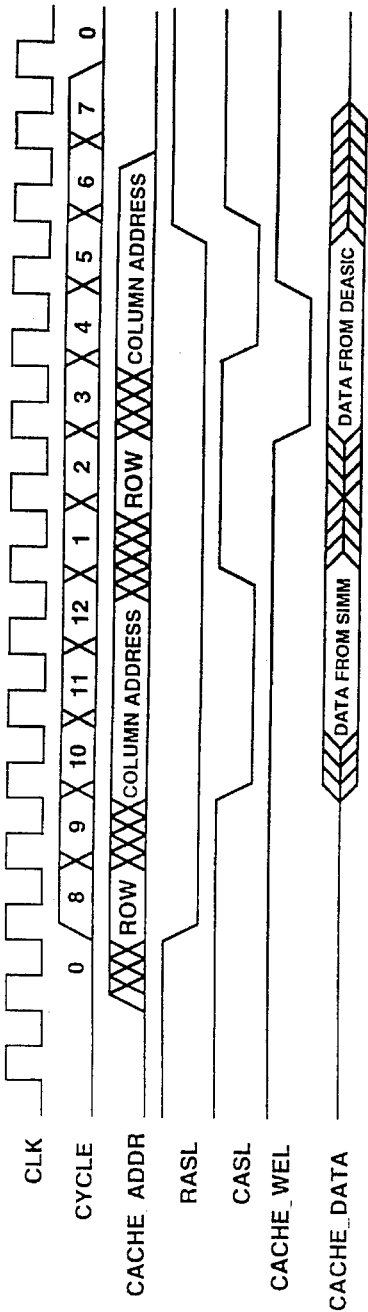
Figure 12C:
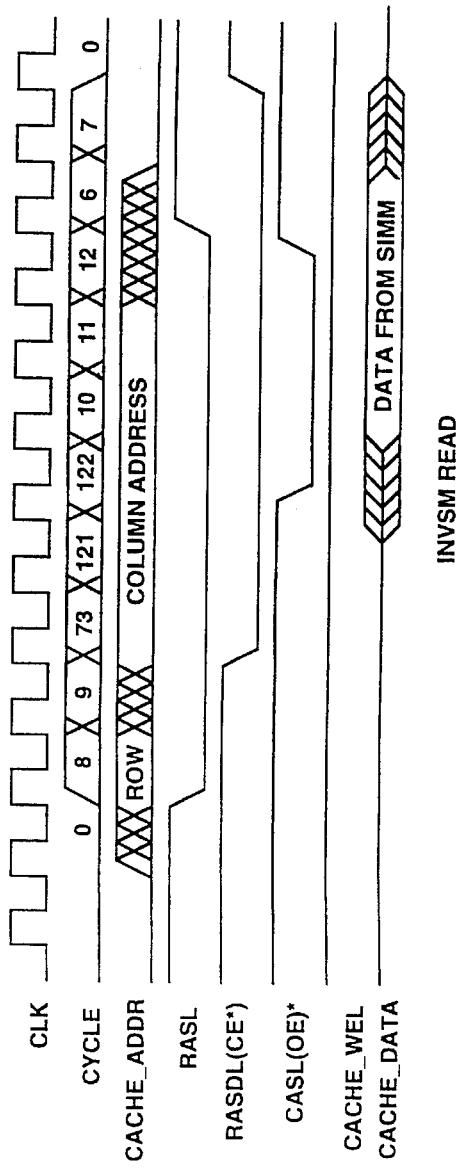
Figure 12D:
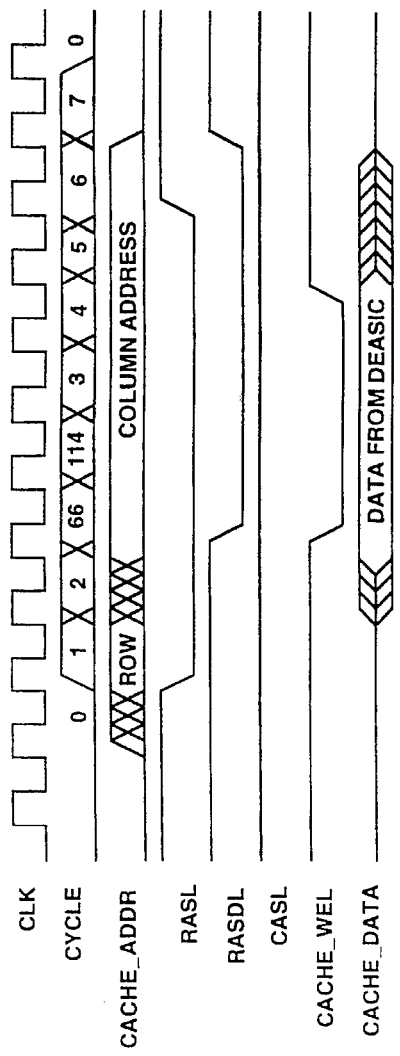
Figure 12E:
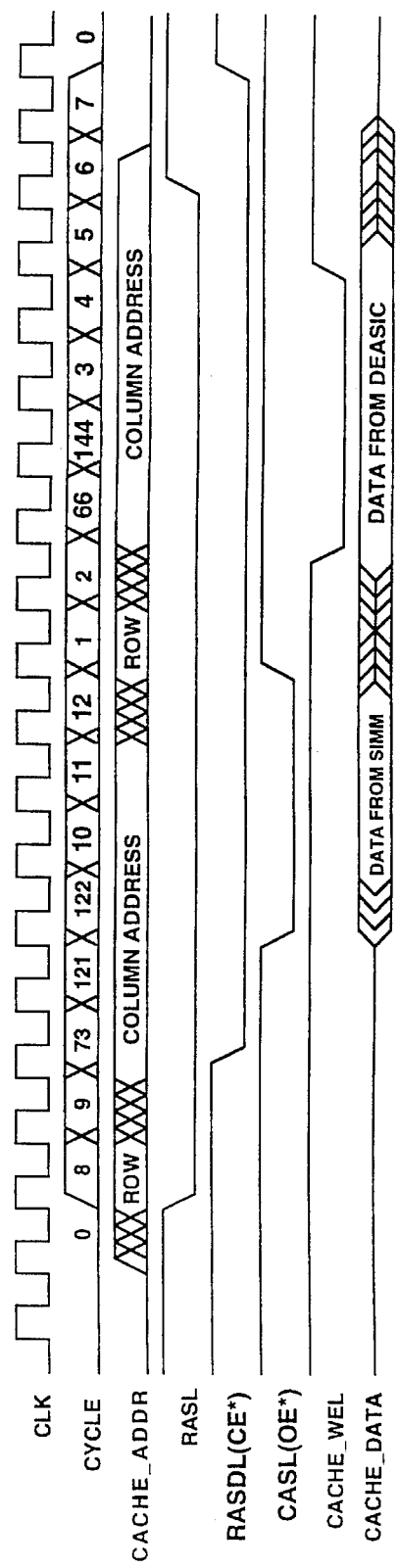
Figure 12F:
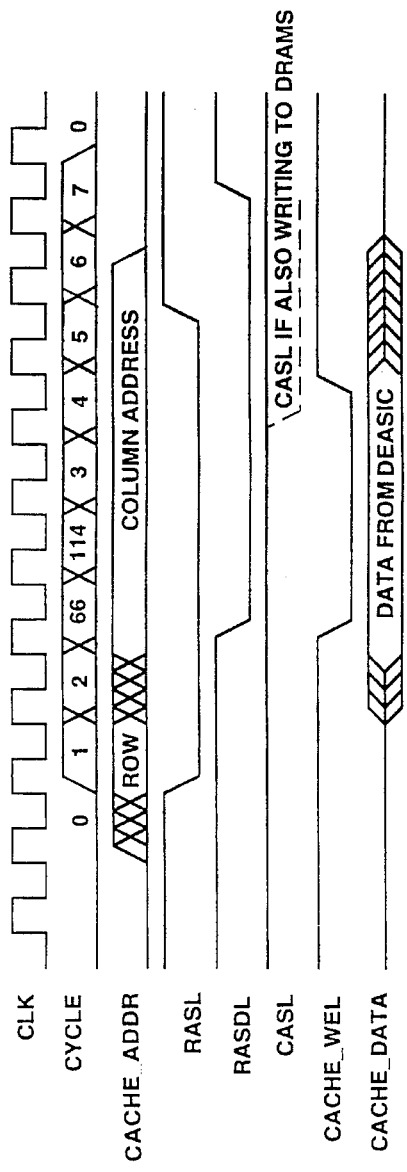
Figure 12G:
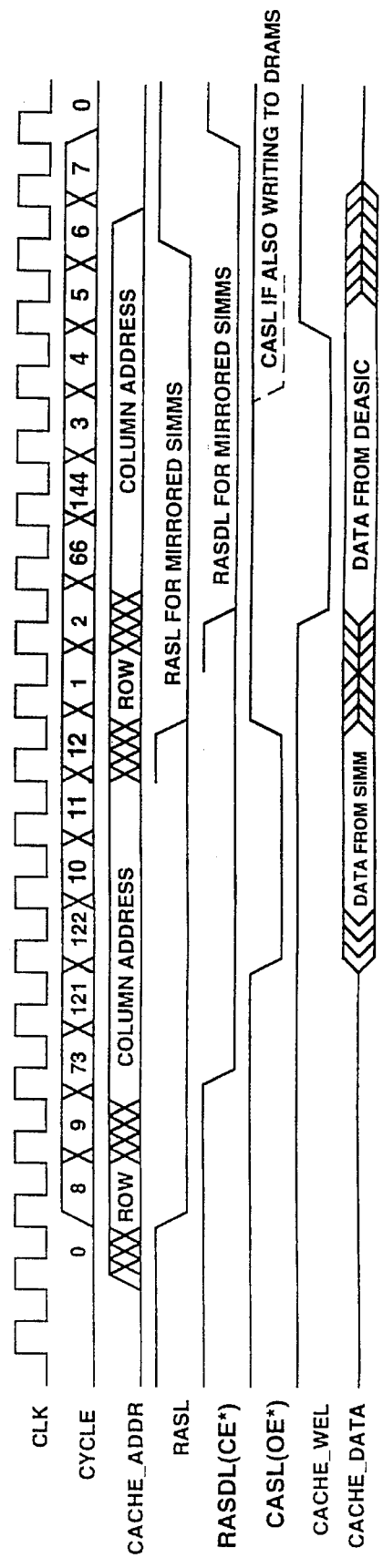
Figure 12H:
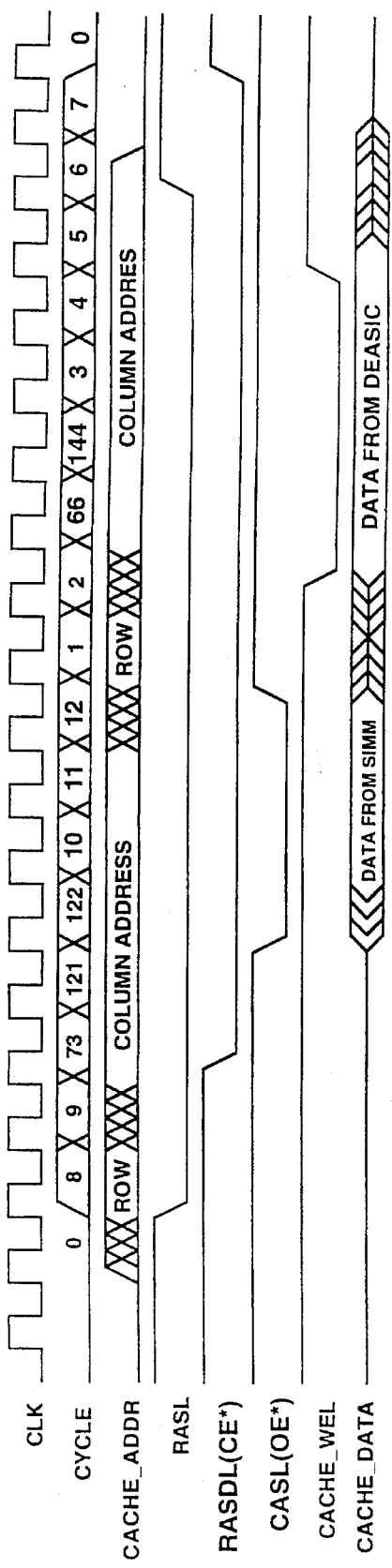
Figure 12I:
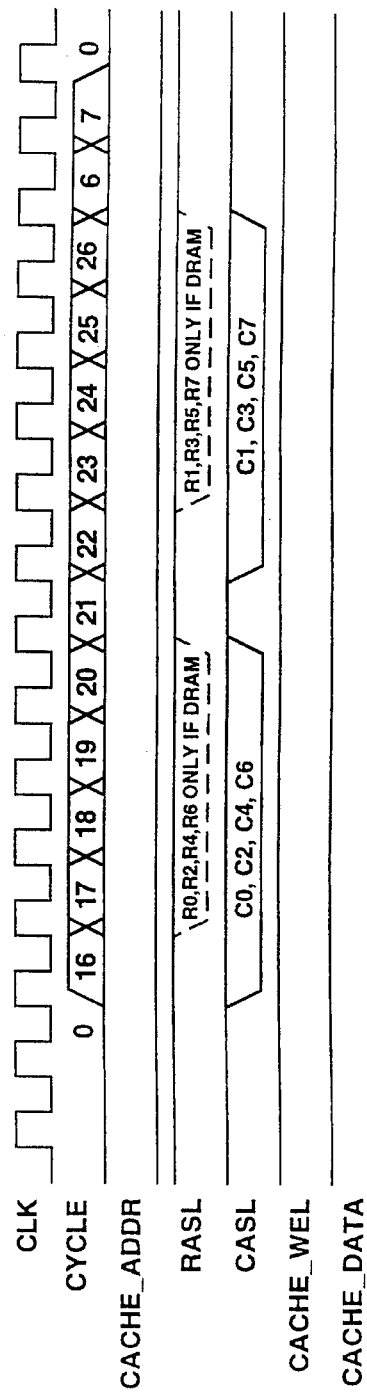

FIGS. 12–12i show the timing diagrams for the various operations which may be performed on volatile (DRAM) SIMM and nonvolatile (INVSM) SIMM. More will be said about the timing diagrams in conjunction with the state diagram for the embodiment of the invention shown in FIG. 2.

Figure 13:
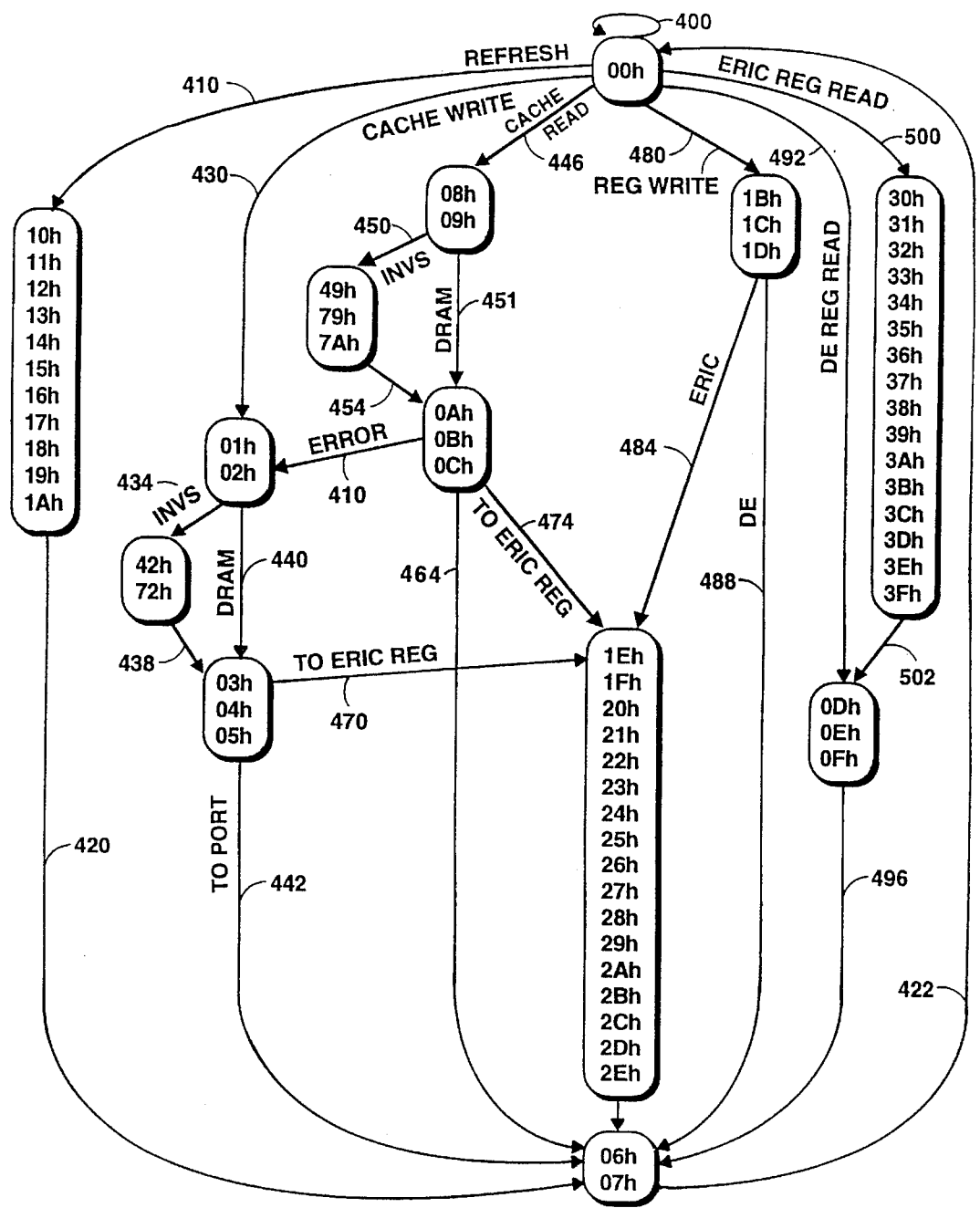
FIG. 13 is a state diagram for an embodiment of a state machine of the invention.

Referring to FIG. 13, the state machine waits (Step 400) in the IDLE state (00H) until a grant is received. If the grant is for a refresh operation, the state machine transitions (Step 410) to a series of states (10H–1AH) to perform the refresh operation. Referring also to FIG. 12i, state (10H) asserts CAS to 4 SIMM slots 40; state (11H) asserts the DRAM RAS in the same 4 SIMM slots; and timing states (12H–14H) provide the appropriate delays. All RAS and CAS are negated in state (15H). In state (16H), CAS is asserted to the remaining 4 SIMM slots, and in the state (17H) DRAM RAS is asserted to the same 4 slots. In state (1AH), RAS and CAS are again negated and the state machine transitions (Step 420) to the end of cycle states (06H, 07H). From the end of cycle states (06H, 07H), the state machine transitions (Step 422) back to the IDLE state (00H).

If a 32 bit SIMM cache write is granted (Step 430), RAS is asserted for each selected SIMM prior to leaving the IDLE state (00H), as shown in FIG. 12a. The state machine switches to the CAS address in state (01H) and sets write enable (WE) in state (02H). If any selected SIMM is non-volatile, the state machine transitions (Step 434) to timing states (42H, 72H). Once the timing delay is completed (Step 438), the state machine transitions to state (03H). If all selected SIMMs are volatile, the state machine transitions (Step 440) directly to state (03H). In state (03H) CAS is asserted for each selected volatile SIMM. In state (04H) write enable is negated and in state (05H) both RAS and CAS are negated. The state machine transitions (Step 442) to the end of cycle states (06H, 07H).

If a cache read, or a cache write of less than 32bits, (Step 446) is granted, RAS is asserted before exiting the IDLE state (00H), as shown in FIG. 12b. In state (08H) the CAS address is selected. If the SIMM is volatile CAS is asserted in state (09H) and the state machine transitions (Step 451) to the two timing states (0AH, 0BH). If the SIMM is non-volatile (Step 450), a timing delay is introduced in states (09H, 49H). CAS is then asserted (Step 79H) and a second delay imposed by state (7AH) before the state machine transitions (Step 454) to timing states (0AH, 0BH). In state (0CH) CAS is negated. In the case of a byte write or an error (Step 460), the state machine transitions to state (01H) and continues as previously discussed. However in the case of an error only the SIMM which was selected for read will be written, and any mirrored copy will not be updated. In the case of a longword read (Step 464) RAS is negated and the state machine transitions to the end of cycle states (06H, 07H). If the RAID port was granted with no error, the state machine transitions (Step 474) directly to state (1EH). If there was an error, the state machine transitions (Step 470) to states (1EH–2EH) which transfer the bytes of data between ASICs.

If the CPU is transferring data to a register (Step 480), the state machine proceeds from the IDLE state (00H) directly into states (1BH–1DH). If the transfer is to an address register (Step 484) the state machine transitions directly to state (1EH), otherwise the state machine transitions (Step 488) directly to the end of cycle states (06H, 07H).

If a data register read is granted (Step 492), the state machine transitions directly from the IDLE state (00H) to states (0DH-0FH) which permits data to be read prior to transitioning (Step 496) to the end of cycle state. If an address register read is granted (Step 500), the state machine transitions to states (30H-3FH) to transfer bytes between ASICs prior to transitioning (Step 502) to state (0DH).

Figure 16:
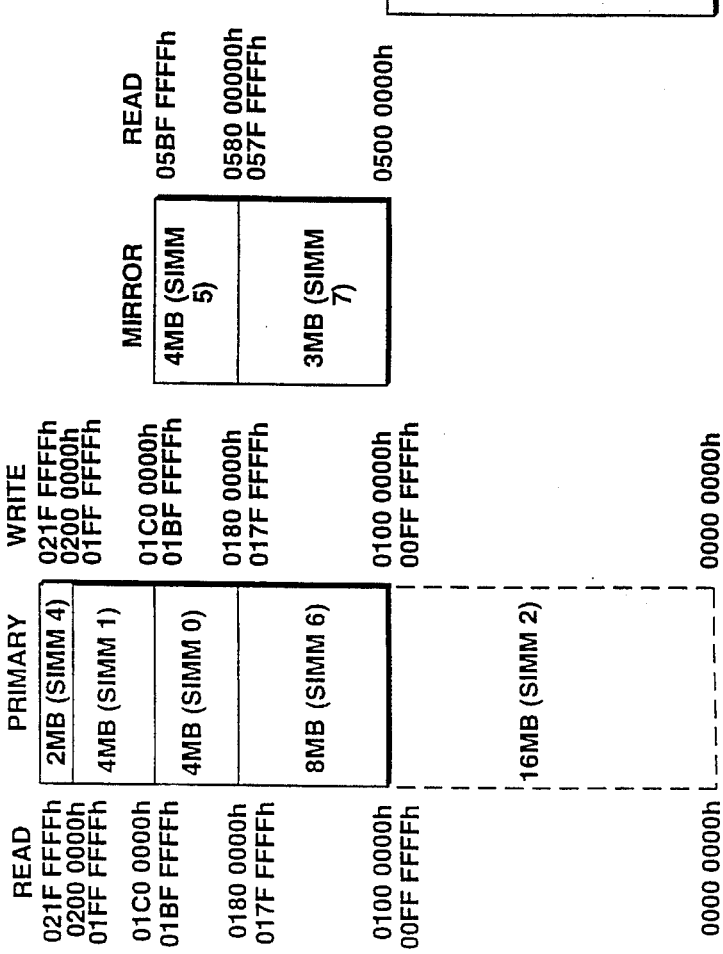
FIG. 16 is an embodiment of a memory map and register address table for an embodiment of the flexible address controller of the invention in which memory space has been partitioned in primary and mirrored memory and in which a SIMM module in primary memory has failed.

FIG. 14 depicts a contiguous memory space configured from a 16 Mbyte, a 4 Mbyte and a 2 Mbyte SIMM. FIG. 15 depicts a memory space which has been partitioned into a primary and a mirrored memory. Note that the write addresses for both the primary and the mirrored memory are the same but that their read addresses differ. FIG. 16 depicts a memory space which has been partitioned into a primary and a mirrored memory. However, in this case one primary SIMM (SIMM 3) has malfunctioned and has been replaced by the equivalent mirrored SIMM (SIMM 2). Thus, mirrored memory now only covers a portion of primary memory.

Although this invention has been discussed in terms of cache memory, the invention is equally applicable to other memory in which the ability to maintain a different write and read address is desired.

Having shown the preferred embodiment, those skilled in the art will realize variations from the disclosed embodiments are possible. Therefore, it is the intention to limit the invention only as indicated by the appended claims.

We claim:

1. A method for addressing data located in a cache memory of a disk controller wherein said cache memory includes a plurality of memory modules, said method comprising the steps of:

for each memory module in said cache memory system, loading a first register with a first read address and a second register with a first write address wherein said first read address is associated with the lowest address within the respective module for read operations and wherein said first write address is associated with the lowest address within the respective memory module for write operations;

for each read operation, selecting one of said plurality of memory modules for the respective read operation based upon the address contained in the first read register for each memory module and reading data from the selected module; and for each write operation, selecting at least one of said plurality of memory modules for the respective write operation based upon the address contained in the second write register for each memory module and writing data to each selected at least one of said plurality of memory modules.

2. A method of addressing a plurality of memory modules in a memory, each said memory module being associated with a corresponding setup register, each said setup register comprising a plurality of fields including a read base address field, a write base address field and a size field, said method comprising the steps of:

loading, with a microprocessor, said read base address field, said write base address field and said size field of each said setup register with said read base address, said write base address and said size of said associated memory module, respectively;

receiving, from a port, an address to be accessed;

comparing, with a read comparator unit, for each said memory module, said address received from said port with said read base address from said read base address field of said setup register associated with said memory module and generating a first predetermined output signal if said address matches said read base address;

comparing, with a write comparator unit, for each said memory module, said address received from said port with said write base address from said write base address field of said setup register associated with said memory module and generating a second predetermined output signal if said address matches said write base address; and selecting at least one of said plurality of memory modules in response to one of said first predetermined output signal and said second predetermined output signal generated by said read comparator units and said write comparator units respectively and further in response to an assertion of a write line, wherein more than one memory module of said plurality of memory modules is selected if said first predetermined output signal or said second predetermined output signal is generated for more than one of said plurality of memory modules.

3. The method of claim 2 wherein said setup register further comprises a kind field, and said method further comprises loading said kind field with indicia of what type of memory module is associated with said setup register.

4. The method of claim 3 wherein each said memory module is accessed according to a number of clock cycles selected in response to said indicia of what type of memory module is associated with said setup register.

5. The method of claim 4 wherein additional clock cycles are used to access said memory module if said memory module is non-volatile.

6. The method of claim 2 wherein said size field is greater than two bits wide.

7. A method of addressing a plurality of memory modules in a memory, each said memory module being associated with a corresponding setup register, each said setup register comprising a plurality of fields including a read base address field, a write base address field and a size field, said method comprising the steps of:

loading, with a microprocessor, said read base address field, said write base address field and said size field of each said setup register with said read base address, said write base address and said size of said associated memory module, respectively;

receiving, from a port, an address to be accessed;

comparing, with a read comparator unit, for each said memory module, said address received from said port with said read base address from said read base address field of said setup register associated with said memory module and generating a first predetermined output signal if said address matches said read base address;

comparing, with a write comparator unit, for each said memory module, said address received from said port with said write base address from said write base address field of said setup register associated with said memory module and generating a second predetermined output signal if said address matches said write base address, wherein each said comparator unit comprises a plurality of comparator modules and wherein the step of comparing, with a read comparator unit, said address received from said port with said read base address and the step of comparing, with a write comparator unit, said address received from said port with said write base address comprises comparing, with consecutive comparator modules, a decreasing number of high order bits of said address with a decreasing number of high order bits of said read base address and said write base address, respectively; and selecting at least one of said plurality of memory modules in response to one of said first predetermined output signal and said second predetermined output signal generated by said read comparator units and said write comparator units respectively and further in response to an assertion of a write line, wherein more than one memory module of said plurality of memory modules is selected if said first predetermined output signal or said second predetermined output signal is generated for more than one of said plurality of memory modules.

8. The method of claim 7 wherein said read comparator unit and said write comparator unit each comprise five comparator modules and a first read comparator module of said read comparator unit and a first write comparator module of said write comparator unit each compare eight high order bits of said address with eight high order bits of said read base address and said write base address, respectively;

a second read comparator module of said read comparator unit and a second write comparator module of said write comparator unit each compare seven high order bits of said address with seven high order bits of said read base address and said write base address, respectively;

a third read comparator module of said read comparator unit and a third write comparator module of said write comparator unit each compare six high order bits of said address with six high order bits of said read base address and said write base address, respectively;

a fourth read comparator module of said read comparator unit and a fourth write comparator module of said write comparator unit each compare five high order bits of said address with five high order bits of said read base address and said write base address, respectively; and a fifth read comparator module of said read comparator unit and a fifth write comparator module of said write comparator unit each compare three high order bits of said address with three high order bits of said read base address and said write base address, respectively.

9. The method of claim 6 wherein which comparator of said plurality of comparator modules is enabled to make said comparison is determined by a value in said size field of said setup register.

10. A method of mirroring the writing of data to at least two memory modules of a plurality of memory modules in a memory, each said memory module being associated with a corresponding setup register, each said setup register comprising a plurality of fields including a read base address field, a write base address field and a size field, said method comprising the steps of:

loading, with a microprocessor, said write base address field of said setup registers corresponding to said at least two memory modules of said plurality of memory modules with the same write base address;

receiving, from a port, an address to be accessed;

comparing, with a write comparator unit, for each said memory module, said address received from said port with said write base address from said write base address field of said setup register for said memory module and generating a predetermined output signal if said address matches said write base address;

indicating by a signal on a write line that a write is requested;

selecting at least two of said plurality of memory modules in response to said predetermined output signal from said write comparator units and further in response to said indication on said write line; and writing data to said address.

11. A memory system comprising:

a plurality of memory modules; and a memory controller comprising:
- a plurality of setup registers, each said setup register having a read base address portion, and a write base address portion;
- a plurality of comparator modules, each comparator module comprising a read comparator unit and a write comparator unit, each of said read comparator unit and write comparator unit having a first input, a second input and an output terminal, said first input of each said read comparator unit in electrical communication with said read base portion of a respective setup register, said second input of said read comparator unit in electrical communication with an address bus, said first input of said write comparator unit in electrical communication with said write base portion of a respective setup register, said second input of said write comparator unit in electrical communication with said address bus; and
- a plurality of control logic circuits, each control logic circuit having a first input terminal in electrical communication with said output terminal of a respective read comparator unit, a second input terminal in electrical communication with said output terminal of a respective write comparator unit and an output terminal in electrical communication with a respective one of said plurality of memory modules, said plurality of control logic circuits selecting at least a respective one of said plurality of memory modules in response to a selection signal produced in response to a comparison between an address on said address bus and one of said read portion and said write portion of said plurality of setup registers by said plurality of comparator units.

12. The memory system of claim 11 wherein each said control logic circuitry further comprises a third input terminal in electrical communication with a write control line, said plurality of control logic circuits selecting at least one of said plurality of memory modules further in response to a predetermined signal on each said third input terminal.

13. The memory system of claim 11 wherein each said setup register further comprises a size portion and each said read comparator unit and write comparator unit further includes a third input terminal, each said third input terminal in electrical communication with said size portion of a respective setup register, each of said plurality of comparator units producing said selection signal further in response to a value in said size portion of a respective setup register.

14. The memory system of claim 11 further comprising a state machine for control of the operation of said memory controller and wherein each said setup register further comprises a kind portion, said state machine in electrical communication with said kind portion of each setup register and controlling the operation of said memory controller in response to a value in said kind portion of each said setup register.

15. A memory system comprising:

a plurality of memory modules; and a memory controller comprising:
- a plurality of setup registers, each said setup register having a read base address portion, and a write base address portion;
- a plurality of comparator modules, each comparator module comprising a read comparator unit and a write comparator unit, each of said read comparator unit and write comparator unit having a first input, a second input and an output terminal, said first input of each said read comparator unit in electrical communication with said read base portion of a respective setup register, said second input of said read comparator unit in electrical communication with an address bus, said first input of said write comparator unit in electrical communication with said write base portion of a respective setup register, said second input of said write comparator unit in electrical communication with said address bus, wherein each said read comparator unit and write comparator unit comprises:
  - a plurality of address comparators, each said address comparator having a first input in electrical communication with one of said respective read base portion and write base portion of a respective setup register, a second input in electrical communication with an address bus, a third input in electrical communication with said size portion of a respective setup register, and an output terminal; and
  - an OR circuit having a plurality of input terminals, each of said plurality of input terminals in electrical communication with a respective one of said output terminals of said plurality of address comparators; and
- a plurality of control logic circuits, each control logic circuit having a first input terminal in electrical communication with said output terminal of a respective read comparator unit, a second input terminal in electrical Communication with said output terminal of a respective write comparator unit and an output terminal in electrical communication with a respective one of said plurality of memory modules, said plurality of control logic circuits selecting at least a respective one of said plurality of memory modules in response to a selection signal produced in response to a comparison between an address on said address bus and one of said read portion and said write portion of said plurality of setup registers by said plurality of comparator units.

16. A memory system comprising:

a plurality of memory modules; and a memory controller comprising:
- a plurality of setup registers, each said setup register having a read base address portion, and a write base address portion;
- a plurality of comparator modules, each comparator module comprising a read comparator unit and a write comparator unit, each of said read comparator unit and write comparator unit having a first input, a second input and an output terminal, said first input of each said read comparator unit in electrical communication with said read base portion of a respective setup register, said second input of said read comparator unit in electrical communication with an address bus, said first input of said write comparator unit in electrical communication with said write base portion of a respective setup register, said second input of said write comparator unit in electrical communication with said address bus, wherein each said read comparator unit and write comparator unit comprises:

a first read comparator of said read comparator unit and a first write comparator of said write comparator unit, each of said first read comparator and first write comparator comparing eight high order bits of said address with eight high order bits of said read base address and said write base address, respectively;

a second read comparator of said read comparator unit and a second write comparator of said write comparator unit, each of said second read comparator and said second write comparator comparing seven high order bits of said address with seven high order bits of said read base address and said write base address, respectively;

a third read comparator of said read comparator unit and a third write comparator of said write comparator unit, each said third read comparator and third write comparator comparing six high order bits of said address with six high order bits of said read base address and said write base address, respectively;

a fourth read comparator of said read comparator unit and a fourth write comparator of said write comparator unit, each said fourth read comparator and fourth write comparator comparing five high order bits of said address with five high order bits of said read base address and said write base address, respectively; and a fifth read comparator of said read comparator unit and a fifth write comparator of said write comparator unit, each said fifth read comparator and said fifth write comparator comparing three high order bits of said address with three high order bits of said read base address and said write base address, respectively; and a plurality of control logic circuits, each control logic circuit having a first input terminal in electrical communication with said output terminal of a respective read comparator unit, a second input terminal in electrical communication with said output terminal of a respective write comparator unit and an output terminal in electrical communication with a respective one of said plurality of memory modules, said plurality of control logic circuits selecting at least a respective one of said plurality of memory modules in response to a selection signal produced in response to a comparison between an address on said address bus and one of said read portion and said Write portion of said plurality of setup registers by said plurality of comparator units.

\* \* \* \* \*

UNITED STATES PATENT AND TRADEMARK OFFICE
CERTIFICATE OF CORRECTION

Page 1 of 2

PATENT NO. : 5,586,300
DATED : December 17, 1996
INVENTOR(S) : Jeffrey A. Wilcox et al.

It is certified that error appears in the above-indentified patent and that said Letters Patent is hereby corrected as shown below:

Column 2, line 23 reads "Figs. 2a and 2c", should read --Figs. 2a- 2e--.

Column 2, line 32 reads "Figs 3a and 3d", should read --Figs 3a and 3b--.

Column 2, line 40 reads "2d-2c", should read --2d-2e--.

Column 2, line 53 reads "7a-7b", should read --7a-7d--.

Column 2, line 55 reads "2a and 2b", should read --2a-2e--.

Column 5, line 6 reads "0001000", should read --00001000--.

Column 6, line 3 reads "Figs. 2a-2b", should read --Figs. 2a-2e--.

Column 6, line 5 reads "and 3b logic diagram", should read --and 3b is a logic diagram--.

Column 6, line 31 reads "7a and 7b", should read --7a-7d--.

Column 7, line 9 reads "7d,", should read --7b--.

UNITED STATES PATENT AND TRADEMARK OFFICE
CERTIFICATE OF CORRECTION

PATENT NO. : 5,586,300
DATED : December 17, 1996
INVENTOR(S) : Jeffrey A. Wilcox, et. al.

It is certified that error appears in the above-indentified patent and that said Letters Patent is hereby corrected as shown below:

Column 10, line 53 reads "claim 6", should read --claim 7--.

Signed and Sealed this

Twenty-eighth Day of July, 1998

Attest:

BRUCE LEHMAN

*Attesting Officer*    Commissioner of Patents and Trademarks